United States Patent [19]

Kanai et al.

[11] Patent Number: 5,976,257
[45] Date of Patent: *Nov. 2, 1999

[54] APPARATUS FOR CONTINUOUSLY FORMING A LARGE AREA DEPOSITED FILM BY MEANS OF MICROWAVE PLASMA CVD PROCESS

[75] Inventors: Masahiro Kanai, Hikone; Koichi Matsuda, Nagahama, both of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/220,575

[22] Filed: Mar. 31, 1994

Related U.S. Application Data

[63] Continuation of application No. 07/924,001, filed as application No. PCT/JP92/00056, Jan. 23, 1992, abandoned.

[51] Int. Cl.$^6$ ............................ C23C 14/00; C23C 16/00; H05H 1/02; H05H 1/30
[52] U.S. Cl. .................................. 118/718; 118/723 MA; 118/729; 118/730; 427/571; 427/575
[58] Field of Search ........................ 427/535, 536, 427/537, 538, 539, 571, 573, 575; 118/718, 723 MW, 723 MA, 723 AN, 723 MR, 728, 729, 730

[56] References Cited

U.S. PATENT DOCUMENTS

| | | | |
|---|---|---|---|
| 3,814,983 | 6/1974 | Weissfloch et al. | 315/39 |
| 4,339,326 | 7/1982 | Hirose et al. | 118/723 AN |
| 4,400,409 | 8/1983 | Izu et al. | 427/39 |
| 4,504,518 | 3/1985 | Ovshinsky et al. | 427/38 |
| 4,517,223 | 5/1985 | Ovshinsky et al. | 427/39 |
| 4,521,717 | 6/1985 | Kieser | 315/39 |
| 4,601,260 | 7/1986 | Ovshinsky | 118/718 |
| 4,615,905 | 10/1986 | Ovshinsky et al. | 427/575 |
| 4,664,951 | 5/1987 | Doehler | 118/718 |
| 4,727,293 | 2/1988 | Asmussen et al. | 118/723 MA |
| 4,729,341 | 3/1988 | Fournier et al. | 118/723 |
| 5,030,476 | 7/1991 | Okamura et al. | 427/39 |
| 5,114,770 | 5/1992 | Echizen et al. | 427/575 |
| 5,126,169 | 6/1992 | Ishihara et al. | 427/255.1 |

(List continued on next page.)

FOREIGN PATENT DOCUMENTS

| | | | |
|---|---|---|---|
| 55-141729 | 11/1980 | Japan | H01L 21/302 |
| 57-133636 | 8/1982 | Japan | H01L 21/31 |
| 61-288074 | 12/1986 | Japan | C23C 16/44 |
| 192374 | 4/1989 | Japan | C23C 16/50 |
| 4092374 | 4/1989 | Japan | 118/723 MA |
| 3-30419 | 2/1991 | Japan | H01L 21/205 |
| 3-30420 | 2/1991 | Japan | H01L 21/205 |
| 3-30421 | 2/1991 | Japan | H01L 21/205 |
| 1207851 | 3/1991 | Japan | C23C 16/50 |
| 1207852 | 3/1991 | Japan | C23C 16/50 |
| 4048928 | 2/1992 | Japan | 118/723 AN |
| 448928 | 2/1992 | Japan | B01J 19/08 |

OTHER PUBLICATIONS

Roppel et al., "Low Temperature Oxidation of Silicon Using a Microwave Plasma Disk Source," J. Vaccum Science & Technology B, 4:295 (1986) Jan./Feb.

Dahimene et al., "The Performance of a Microwave Ion Source Immerised in in a Multicusp Static Magnetic Field," J. Vacuum Science & Technology B, 4:126 (1986) Jan./Feb.

Primary Examiner—Marianne Padgett
Attorney, Agent, or Firm—Fitzpatrick, Cella, Harper & Scinto

[57] ABSTRACT

A method and apparatus for forming a large area functional deposited film on the surface of a continuously moving web member by means of a microwave plasma CVD process, characterized in that at the exterior face of the circumferential wall comprising a curved continuously moving web member of the microwave plasma CVD film-forming chamber, a member having a function of transporting the web member while pressing it and being provided with a mechanism capable of controlling the temperature of the web member is disposed.

8 Claims, 34 Drawing Sheets

U.S. PATENT DOCUMENTS

| | | | |
|---|---|---|---|
| 5,130,170 | 7/1992 | Kanai et al. | 427/575 |
| 5,149,375 | 9/1992 | Matsuyama | 118/719 |
| 5,192,717 | 3/1993 | Kawakami et al. | 439/233 |
| 5,224,441 | 7/1993 | Felts et al. | 118/718 |
| 5,269,848 | 12/1993 | Nakagawa | 118/723 |
| 5,294,285 | 3/1994 | Kanai et al. | 156/610 |

APPARATUS FOR CONTINUOUSLY FORMING A LARGE AREA DEPOSITED FILM BY MEANS OF MICROWAVE PLASMA CVD PROCESS

This application is a continuation of application Ser. No. 07/924,001 filed Nov. 20, 1992, now abandoned.

FIELD OF THE INVENTION

The present invention relates to a process and an apparatus for continuously forming a large area functional deposited film by sustaining a substantially uniform microwave plasma over a large area to cause plasma reactions by which a film-forming raw material gas is excited and decomposed.

More particularly, the present invention relates to a process and an apparatus which enable one to continuously form a large area functional deposited film of uniform thickness with a markedly improved gas utilization efficiency of a film-forming raw material gas at a high deposition rate. The present invention enables one to mass-produce large area thin film semiconductor devices such as photovoltaic devices at a reduced cost.

BACKGROUND OF THE INVENTION

Along with a marked increases in power generation to meet an increased demand for power supply in the recent years, problems of environmental pollution have become serious in the world.

In fact, atomic power generation was anticipated as a means of generating power capable of replacing steam-power generation and has been in operation in some places of the world. However, there were occurrences represented by Chernobyl nuclear power plant disaster, where the systems broke down to cause radioactive contamination. Because of this, further development of the system of atomic power generation is feared. There are some countries that effected regulations prohibiting establishment of new atomic power plants.

Now, in the case of the generation of steam power, the amount of a fossil fuel represented by coal or petroleum to be consumed for power generation in order meet the social demand for increased power supply has been continuously increased and along with this, the amount of carbon dioxide gas exhausted from the steam-power generation plants has been continuously increased resulting an increase in the carbon dioxide content of gases in the air to cause a greenhouse effect. This results in providing a global-warming phenomenon. In fact, the annual average temperature of the earth has increased in the recent years. In view of this, International Energy Agency has proposed reducing the amount of carbon dioxide exhausted from the steam-power generation plant by as much as 20% of the current level by the year of 2005.

Against this background, the populations of the developing countries will continue to increase and a demand for power supply will also be increased. In addition to this, it is expected that the manner of living in the developed countries will be further modernized. With further developments in electronic instruments the amount of power consumption per person will be eventually increased.

In view of the above, the matter of power supply is now a subject to be internationally discussed in terms of the earth.

Public attention has now focused on and various studies have been made of generating power using a solar cell since it has various advantages: it is a clean power generation system which is free of problems relating to radioactive contamination, global-warming and environmental pollution; the sunlight to be used as its energy source reaches everywhere on the earth and there is not a problem for the energy source to be localized; and the power generation equipment can be simplified and a relatively high power generation efficiency can be attained.

Now, in order for the solar cell power generation system to supply power in a quantity to satisfy the social demand, the solar cell to be used should provide a sufficiently high photoelectric conversion efficiency, it should stably exhibit solar cell characteristics an d it should be mass-produced.

In order to provide the average family with adequate power, a solar cell capable of outputting a power of about 3 KW is necessary. In this case, the photoelectric conversion efficiency of the solar cell should be about 10%, the solar cell is required to have an area of about 30 $m^2$ in order to provide said power. And in the case where it is intended to satisfy the demands for power supply for 100,000 families, the solar cell is required to have an area of 3,000,000 $m^2$.

In view of this, public attention has been focused on an amorphous silicon solar cell which can be prepared by depositing a semiconductor film such as an amorphous silicon semiconductor film on a relatively inexpensive substrate such as glass or metal sheet wherein glow discharge is caused in a film-forming raw material gas such as silane gas. Such a solar cell can be mass-produced and can be provided at a lower cost in comparison with a solar cell prepared by using a single crystal silicon or the like. Various proposals have been made for the process of producing said amorphous silicon solar cell.

In the case of the power generation system using a solar cell, usually a plurality of unit modules are connected in series or in a row to form a unit from which a desired current or voltage can be obtained. For each of said plurality of modules, it is required that neither disconnection nor shunt circuit occur. It is further required that each of said plurality of modules stably outputs an even current or voltage. In order to satisfy these requirements, each unit module is necessarily prepared such that its most important constituent semiconductor layer stably exhibits the uniform characteristics required therefor. Further, to make it easy to design the module and also to simplify the process for assembling a plurality of unit modules in to a unit, it is essential to provide a large area semiconductor film having an uniformity not only in thickness but also in quality and capable of exhibiting uniform semiconductor characteristics. These features enable the mass-production of a solar cell and reduce the production cost. In the solar cell, the constituent semiconductor layers, which are the basic constituent elements thereof, are conjugated to form a semiconductor junction such as pn junction or pin junction. These semiconductor junctions can be attained by stacking different semiconductor layers having a different conduction type one from another, or by ion-implanting or thermally diffusing a dopant of a different conduction type into one of the constituent semiconductor layers of the same conduction type.

This situation will be further described in the case of the foregoing amorphous silicon solar cell. It is known that glow discharge is caused in a gas mixture composed of a film-forming raw material gas such as silane gas and a raw material gas capable of supplying a dopant element such as phosphine ($PH_3$) or diborane ($B_2H_6$) forming semiconductor films having a desired conduction type and a desired semiconductor junction can be easily attained by sequentially stacking these semiconductor films on a desired substrate.

For instance, in order to prepare an amorphous silicon series solar cell, there has been proposed a method wherein a plurality of independent film-forming chambers for forming the respective semiconductor films therein are provided and each of the semiconductor films is formed in the corresponding film-forming chamber.

The specification of U.S. Pat. No. 4,400,409 discloses a continuous plasma CVD apparatus wherein the so-called roll-to-roll system is employed. The specification describes that said apparatus makes it possible to continuously form an element having a semiconductor junction by providing a plurality of glow discharge regions through each of which regions a lengthy flexible substrate having a desired width is to be moved. A semiconductor film of a desired conduction type is formed on said substrate in each of said plurality of glow discharge regions while continuously moving said substrate in the longitudinal direction. The specification describes that a gas gate is provided between the adjacent glow discharge regions in order to prevent a raw material gas to be used in one glow discharge region from entering into the other glow discharge region. In more detail, said plurality of glow discharge regions are isolated one from the other by an isolation passage way provided with means for forming a cleaning gas stream of Ar, $H_2$, etc. It can be said that this roll-to-roll system will be suitable for the mass-production of a semiconductor device. However, since each of the constituent semiconductor layers is formed by the plasma CVD method using a RF energy, there is a limit for continuously forming those constituent semiconductor layers at a high deposition rate while maintaining the characteristics desired for each of those constituent semiconductor layers. That is, even in the case of forming a thin semiconductor layer of, for example, about 5000 Å, it is necessary to always produce prescribed plasma and sustain the plasma in a uniform state over a large area. However, there are many correlated film-forming parameters which are difficult to generalize and highly skilled techniques are required to do so. In addition to this, there are still other unresolved problems that the decomposition rate and the utilization efficiency of a film-forming raw material gas are not sufficient and thus the product becomes unavoidably costly.

Japanese Unexamined Patent Publication Sho. 61-288074 discloses a roll-to-roll film-forming apparatus comprising a reaction chamber containing a hood-like shaped curtaining portion of a flexible substrate web, said reaction chamber having a reaction space circumscribed by said hood-like shaped curtaining portions and said reaction chamber being provided with at least an activation chamber isolated from said reaction chamber. The film formation is carried out by introducing active species formed in said activation chamber and if necessary, other film-forming raw material gas into said reaction space and chemically reacting them with the action of a heat energy to form a deposited film on the inner surface of said hood-like shaped curtaining portion positioned in said reaction chamber. This apparatus is advantageous in that the apparatus can be relatively compact and the deposition rate of a film to be formed may be improved because of using an active species in comparison with the known plasma CVD apparatus. However, this film-forming apparatus utilizes chemical reaction to cause film formation with the aid of a heat energy. Therefore, when the deposition rate of a film to be formed is desired to be increased, it is necessary to increase not only the flow rate of an active species into the reaction space but also the quantity of a heat energy to be supplied. However, it is extremely difficult to do so since there is a limit not only for the manner of generating a large amount of the active species in the activation chamber and sufficiently introducing the active species into the reaction space at a high flow rate without leakage but also for uniformly supplying a large quantity of the heat energy into the reaction space.

In addition, since the means of providing the hood-like shaped curtaining portion comprises merely two transportation rollers for transporting the substrate web and the hood-like shaped curtaining portion is formed by the self-holding power of the substrate web, there are problems such that the inside volume of the space circumscribed by the substrate web is liable to change, resulting in a change in the film-forming conditions. The substrate temperature is liable to suffer from influence of a change in the pressure in the space, resulting in unevenness in the characteristics of a film formed, since the calorific capacity of the substrate web itself is relatively small. Thus, there is a serious disadvantage that it is required to adjust the substrate temperature at the position in contact with the substrate web.

In recent years, a plasma process using microwave has been spotlighted because microwave makes it possible to provide an energy density which is higher than that provided by RF in the prior art and it is suitable for effectively producing and maintaining plasma, since microwave is short in frequency band.

For instance, the specifications of U.S. Pat. Nos. 4,517,223 and 4,504,518 describe methods for forming deposited thin films on small area substrates in a microwave glow discharge plasma under a low pressure condition. These two patent specifications describe that because the methods are conducted under low pressure conditions, any of these methods makes it possible to obtain a high quality deposited film at a remarkably high deposition rate while eliminating not only polymerization of active species which gives negative effects to the characteristics of a film to be formed but also formation of powder such as polysilane in the plasma. However, neither of these two patent specifications mentions anything about uniform deposition of a film over a large area.

The specification of U.S. Pat. No. 4,729,341 discloses a low pressure microwave plasma CVD method and an apparatus suitable for practicing the same, wherein a photoconductive semiconductor thin film is deposited on a large area cylindrical substrate using a pair of radiative waveguide applicators in a high power process. However, the principles of large area film deposition are limited to cylindrical substrates for electrophotographic photoreceptors, and the teachings described therein are not directly transferable to planar substrates of large area. Further, the film-forming method is to be practiced in a batch system and the amount of film products obtained by one batch is limited. The specification does not teach anything about continuous film deposition on a large area planar substrate.

Now, there still remain various problems to be solved for large area film deposition because non-uniformity of a microwave energy is apt to occur in microwave plasma due to the wavelength of a microwave being short. For example, there is an attempt to use a slow microwave structure in order to provide uniformity of the microwave energy. However, there is an inherent problem in the slow microwave structure in that there is the very rapid fall off of microwave coupling into the plasma as a function of distance transverse to the microwave applicator. In order to solve this problem, a proposal has been made that the spacing of the slow microwave structure from a substrate to be processed is varied to thereby make the energy density in the vicinity of the substrate surface uniform.

For example, such a proposal can be found in the specification of U.S. Pat. No. 3,814,983 or the specification of U.S. Pat. No. 4,521,717. More particularly, the former patent specification discloses that it is necessary to incline the slow wave structure at a certain angle with respect to the substrate. However, inclination of the slow wave structure leads to an insufficient coupling of a microwave energy into the plasma. The latter patent specification discloses the use of two slow wave structures in an anti-parallel arrangement but in parallel to the substrate. More particularly, the latter patent specification discloses that it is desirable to set the two slow wave applicators at an angle to each other so that the planes normal to the medians of the applicators intersect at a straight line which extends parallel to the surfaces of the substrate to be processed and at right angles to the travel direction of the substrate; and that in order to avoid destructive interference between the two s low wave applicators, it is desirable to displace the two slow wave applicators from each other transversly of the travel direction of th e substrate by a distance equal to half of the space between the cross-bars of th e waveguide.

There have been several proposals made in order to provide plasma uniformity (that is, energy uniformity). Such proposals are found, for example, in Journal of Vacuum Science Technology, B-4 (January–February of 1986) PP. 295–298 and in the same document, (January–February of 1986) PP. 126–130. These reports describe a microwave reactor called a microwave plasma disc source (MPDS) and that the plasma is in the shape of a disc or tablet, with a diameter that is a function of microwave frequency. More particularly, the reports describe that the plasma disc source can be varied with the frequency of microwave. However, in the case of a microwave plasma disc source which is designed for operation at the normal microwave frequency of 2.45 GHz, the plasma confined diameter is about 10 cm at the most and the plasma volume is about 118 $cm^3$ at the most. This is far from a large surface area. The reports also describe that in the case of a system designed for operation at the lower frequency of 915 MHz, the lower frequency source would provide a plasma diameter of approximately 40 cm with a plasma volume of 2000 $cm^3$. The reports further describe that the microwave plasma disc source can be scaled up to discharge diameters in excess of 1 m by operating at still lower frequencies, for example, 40 MHz. However extreme expenses are required to establish such an apparatus which can perform this. More particularly in this respect, it will be possible to attain large area plasma by lowering the frequency of microwave employed. But the high power microwave power source with such frequency region is not generally available. If it should be accessible, it will be extremely costly. In addition, as for the frequency variable high power microwave power source, it is difficult to acquire such power source.

In order to effectively provide high density plasma using microwave, there have been ways proposed to establish the electron cyclotron resonance condition (namely, the ECR condition) by arranging electromagnets around the cavity resonator as found in Japanese Unexamined Patent Publications Sho. 55-141729 and Sho. 57-133636. At academic meetings, etc., there have been methods reported of forming various semiconductor thin films by utilizing high density plasma. Some microwave ECR plasma CVD apparatus capable of performing such methods have been commercialized.

However, it has been generally recognized in the technical field to which the invention pertains that it is technically difficult to form a deposited film uniformly over a large area substrate because of non-uniformity of plasma caused by the wavelength of microwave and also because of non-uniformity of magnetic field distribution due to the use of the magnets for the control of plasma. In the case where the microwave ECR plasma CVD apparatus is intended to be scaled up so that film deposition over a large area can be done, there are various problems to be solved: 1) electromagnets to be used must also be scaled up; 2) means for preventing the apparatus from overheating must be provided; and 3) a special DC high power regulated supply must be provided.

Further, as for the deposited film obtained, it is usually inferior to the deposited film obtained by the known RF plasma CVD method with respect to the film property. In addition, in the case of forming a deposited film on a substrate by the microwave ECR plasma CVD method, there is a distinguishable difference with respect to the film deposition rate and the film property between the film formed in the space where the ECR condition is established and the film formed in the space where the ECR condition is not established, in the dispersed magnetic field space in other words. In view of this, the microwave ECR plasma CVD method is not suitable for the preparation of such a semiconductor device that is required to excel in quality and in uniformity with respect to the characteristics to be provided.

The foregoing U.S. Pat. Nos. 4,517,223 and 4,729,341 describe the necessity of maintaining very low pressures in order to provide high density plasmas. That is, they describe that the use of low pressures is necessary in order to obtain a high film deposition rate and/or a high gas utilization efficiency. However, the foregoing slow wave structure and electron cyclotron resonance method is not sufficient to maintain the relationships among high film deposition rate, high gas utilization efficiency, high power density and low pressure.

In view of the problems described above, there is an increased demand for eliminating the foregoing problems of the known microwave plasma CVD method and providing an improved microwave plasma CVD process which is free of such problems.

There is also another demand for providing a large area or lengthy thin semiconductor film excelling in quality and uniformity of characteristics which is desirably usable in not only solar cells but also in semiconductor devices such as TFTs, photoelectric conversion elements for contact image sensors, switching elements, image input line sensors, etc. at a reduced cost.

SUMMARY OF THE INVENTION

The principal object of the present invention is to improve the inventions relating to microwave plasma CVD film-forming method and microwave plasma CVD apparatus (hereinafter referred to as the prior microwave plasma CVD apparatus) by Masahiro KANAI, one of the present inventors, together with others or by himself, which are disclosed in Japanese patent application Hei.1-166230, Japanese patent application Hei.1-166231, Japanese patent application Hei.1-166233, Japanese patent application Hei.1-207851, Japanese patent application Hei.1-207851 and Japanese patent application Hei.1-207852.

Other object of the present invention is to eliminate the foregoing problems in the known method and apparatus of forming a thin film semiconductor device and to provide an improved microwave plasma CVD film-forming method and apparatus which enable one to continuously form a functional deposited film uniformly over a large area substrate at a high deposition rate.

A further object of the present invention is to provide an improved microwave plasma CVD film-forming method and apparatus which enable one to continuously form a functional deposited film on a web member.

A further object of the present invention is to provide an improved microwave plasma CVD film-forming method and apparatus which enable one to mass-produce a thin film semiconductor device with a markedly high gas utilization efficiency and at a reduced production cost.

A further object of the present invention is to provide an improved method and apparatus which enable one to provide substantially uniform microwave plasma over a large area and volume.

A further object of the present invention is to provide an improved microwave plasma CVD film-forming method and apparatus which enable one to continuously and stably form a photovoltaic element on a lengthy substrate of relatively large width which provides a high photoelectric conversion efficiently with a high yield.

The microwave plasma CVD apparatus disclosed in each of the foregoing Japanese patent applications will be described below.

The microwave plasma CVD apparatus disclosed in Hei. 1-166230: an apparatus for continuously forming a functional deposited film on a continuously moving web member by a microwave plasma CVD process, characterized by comprising a substantially enclosed columnar film-forming chamber having a curved circumferential wall formed by curving and projecting said web member on the way of said web member to be moving in the longitudinal direction by means of curved portion-forming means; a microwave applicator means for producing microwave plasma in said film-forming chamber, said microwave applicator means being so designed that microwave energy is radiated in the direction in parallel to the direction of microwave propagation; an exhaust means for exhausting the inside of said film-forming chamber; means for introducing a film-forming raw material gas into said film-forming chamber; and a temperature controlling means for heating and/or cooling said web member, wherein a deposited film is continuously formed on the surface of said web member which is exposed to said microwave plasma.

The microwave plasma CVD apparatus disclosed in Hei. 1-166231: an apparatus for continuously forming a functional deposited film on a continuously moving web member by a microwave plasma CVD process, characterized by comprising a substantially enclosed columnar film-forming chamber having a curved circumferential wall formed by curving and projecting said web member on the way of said web member to be moving in the longitudinal direction by means of curved portion-forming means; a microwave applicator means for producing microwave plasma in said film-forming chamber, said microwave applicator means being so designed that microwave energy is radiated or propagated with a directivity in one direction perpendicular to the direction of microwave propagation; an isolation means for permitting said microwave energy radiated or propagated with a directivity in one direction perpendicular to the direction of microwave propagation to transmit into said film-forming chamber and for isolating said microwave applicator from said microwave plasma produced by the action of said microwave energy in said film-forming chamber; an exhaust means for exhausting the inside of said film-forming chamber; means for introducing a film-forming raw material gas into said film-forming chamber; and a temperature controlling means for heating and/or cooling said web member, wherein a deposited film is continuously formed on the surface of said web member which is exposed to said microwave plasma.

The microwave plasma CVD apparatus disclosed in Hei. 1-166233: an apparatus for continuously forming a functional deposited film on a continuously moving web member by a microwave plasma CVD process, characterized by comprising a substantially enclosed columnar film-forming chamber having a curved circumferential wall formed by curving and projecting said web member on the way of said web member to be moving in the longitudinal direction by means of supporting and transporting means; means for maintaining the inside of said film-forming chamber substantially in a vacuum state; a microwave coaxial line capable of supplying a microwave power in order to produce plasma in said film-forming chamber; a central conductor isolation means constituted by a material capable of transmitting said microwave power supplied from said microwave coaxial line, said central conductor isolation means being capable of isolating the central conductor of said microwave coaxial line from a film-forming raw material gas; means for exhausting the inside of said film-forming chamber; and means for introducing said film-forming raw material gas into said film-forming chamber, wherein a deposited film is continuously formed on the surface of said web member which is exposed to said microwave plasma.

The microwave plasma CVD apparatus disclosed in Hei. 1-207851: an apparatus wherein a bias voltage applying means capable of controlling the plasma potential of microwave plasma is disposed in the apparatus disclosed in Hei. 1-166230.

The microwave plasma CVD apparatus disclosed in Hei. 1-207851: an apparatus wherein a bias voltage applying means capable of controlling the plasma potential of microwave plasma is disposed in the apparatus disclosed in Hei. 1-166231.

The microwave plasma CVD apparatus disclosed in Hei. 1-207852: an apparatus wherein a bias voltage applying means capable of controlling the plasma potential of microwave plasma is disposed in the apparatus disclosed in Hei. 1-166233.

According to any of these microwave plasma CVD apparatus disclosed in the 6 Japanese patent applications, not only plasma is stably and repeatedly produced but also the utilization efficiency of a raw material gas is improved, and it is possible to continuously form a large area functional deposited film of satisfactory uniformity.

However, in any of these microwave plasma CVD apparatus, since the film-forming chamber is formed by curving and projecting the continuously moving web member, it is required to use a relatively thin web member as the moving web member. In view of this, highly-skilled techniques are required in order to establish and maintain always the film-forming chamber in the form of a desired shape by curving and projecting such thin web member as it is moving. In addition, any of the foregoing microwave plasma CVD apparatus has the temperature controlling mechanism outside the film-forming chamber, in which the temperature of the inside of the film-forming chamber is controlled externally. The temperature of the inside of the film-forming chamber becomes considerably elevated upon film formation, and along with this, the thin web member as the constituent member of the film-forming chamber is heated to a considerably high temperature. Although the thin web member is cooled by the temperature controlling mechanism, the temperature controlling mechanism is situated at the position above the exterior of the circumferential wall comprising the thin web member of the film-forming chamber and it is not in contact with said exterior. Because of this, the cooling of the thin web member constituting the circumferential wall of the film-forming chamber is sometimes localized. Local deformation sometimes occur at the thin web member constituting the circumferential wall of the film-forming chamber. This causes unevenness for the plasma produced in the film-forming chamber, negatively influencing the thickness and other properties of the film to be formed.

In addition, when the cooling of the inside of the film-forming chamber is not effective, the constituent members of the opposite sides of the film-forming chamber are sometimes damaged due to high temperature.

In any of the foregoing microwave plasma CVD apparatus, high-skilled techniques are required in order to prevent such problems as above described from occurring. Any of the six Japanese patent applications do not mention any effective solution to solve those problems.

The present invention has been accomplished as a result of the studies aiming at eliminating the foregoing problems in the microwave plasma CVD apparatus described in the six Japanese patent applications discussed. The present inventors made extensive studies in order to eliminate the foregoing problems in the microwave plasma CVD apparatus described in the six Japanese patent applications (hereinafter referred to as "the prior microwave plasma CVD apparatus"). The inventors found that the foregoing problems can be eliminated when a magnetic body member provided with a mechanism having a function of transporting the web member while pressing it and capable of controlling the temperature of the web member is disposed at the peripheral face of the circumferential wall comprising the curved continuously moving web member of the film-forming chamber.

The present invention has been accomplished as a result of further studies based on the above finding. The present invention includes the following embodiments.

First Embodiment

A method for continuously forming a large area functional deposited film by a microwave plasma CVD process comprising continuously moving a web member in the longitudinal direction; establishing a columnar film-forming space by curving and projecting said moving web member so as to be the circumferential wall of said film-forming space; introducing a film-forming raw material gas through a gas feed means into said film-forming space while simultaneously radiating a microwave energy into said film-forming space by using a microwave applicator means capable of radiating a microwave energy in a direction substantially parallel to the direction of microwave propagation into said film-forming space to generate microwave plasma in said film-forming space, thereby continuously forming a deposited film on the surface of said continuously moving circumferential wall which is exposed to said plasma. The film formation is performed while controlling the temperature of the web member by means of a magnetic member provided with a mechanism having a function of transporting the web member while pressing it and capable of controlling the temperature of the web member, said magnetic member being disposed in contact with the face of the web member opposite the face thereof which is exposed to the microwave plasma.

Second Embodiment

A method for continuously forming a large area functional deposited film by a microwave plasma CVD process comprising continuously moving a web member in the longitudinal direction; establishing a columnar film-forming space by curving and projecting said moving web member so as to be the circumferential wall of said film-forming space; introducing a film-forming raw material gas through a gas feed means into said film-forming space while simultaneously radiating or propagating a microwave energy into said film-forming space by using a microwave applicator means capable of radiating or propagating a microwave energy with a directivity in one direction perpendicular to the direction of microwave propagation into said film-forming space to generate microwave plasma in said film-forming space, thereby continuously forming a deposited film on the surface of said continuously moving circumferential wall which is exposed to said plasma. In this embodiment the film formation is performed while controlling the temperature of the web member by means of a magnetic member provided with a mechanism having a function of transporting the web member while pressing it and capable of controlling the temperature of the web member, said magnetic member being disposed in contact with the face of the web member opposite the face thereof which is exposed to the microwave plasma.

Third Embodiment

A method for continuously forming a large area functional deposited film by a microwave plasma CVD process comprising continuously moving a web member in the longitudinal direction; establishing a columnar film-forming space by curving and projecting said moving web member so as to be the circumferential wall of said film-forming space; introducing a film-forming raw material gas through a gas feed means into said film-forming space while simultaneously radiating a microwave energy into said film-forming space by using a microwave antenna capable of radiating a microwave energy in a direction perpendicular to the direction of microwave propagation into said film-forming space to generate microwave plasma into said film-forming space, thereby continuously forming a deposited film on the surface of said continuously moving circumferential wall which is exposed to said plasma. The film formation is performed while controlling the temperature of the web member by means of a magnetic member provided with a mechanism having a function of transporting the web member while pressing it and capable of controlling the temperature of the web member, said magnetic member being disposed in contact with the face of the web member opposite the face thereof which is exposed to the microwave plasma.

Fourth Embodiment

A modification of each of the above first to third embodiments, characterized in that the formation of said deposited film is performed while controlling the potential of the microwave plasma.

Fifth Embodiment

In the apparatus for continuously forming a functional deposited film on a continuously moving web member by a microwave plasma CVD process, said apparatus comprising a substantially enclosed columnar film-forming chamber having a curved circumferential wall formed by curving and projecting said web member on the way of said web member to be moving in the longitudinal direction by means of curved portion-forming means; a microwave applicator means for producing microwave plasma in said film-forming chamber, said microwave applicator means being so designed that microwave energy is radiated in the direction in parallel to the direction of microwave propagation; an exhaust means for exhausting the inside of said film-forming chamber; means for introducing a film-forming raw material gas into said film-forming chamber; and a temperature controlling means for heating and/or cooling said web member, wherein a deposited film is continuously formed on the surface of said web member which is exposed to said microwave plasma, an improvement characterized in that a magnetic member is disposed to be in contact with the face of the web member opposite the face thereof which is exposed to the microwave plasma by virtue of the magnetic force, said magnetic member being provided with a temperature controlling mechanism capable of heating and/or cooling the web member.

Sixth Embodiment

In the apparatus for continuously forming a functional deposited film on a continuously moving web member by a microwave plasma CVD process, said apparatus comprising a substantially enclosed columnar film-forming chamber having a curved circumferential wall formed by curving and projecting said web member on the way of said web member to be moving in the longitudinal direction by means of curved portion-forming means; a microwave applicator means for producing microwave plasma in said film-forming chamber, said microwave applicator means being so designed that microwave energy is radiated or propagated with a directivity in one direction perpendicular to the direction of microwave propagation; an isolation means for permitting said microwave energy radiated or propagated with a directivity in one direction perpendicular to the direction of microwave propagation to transmit into said film-forming chamber and for isolating said microwave applicator from said microwave plasma produced by the action of said microwave energy in said film-forming chamber; an exhaust means for exhausting the inside of said film-forming chamber; means for introducing a film-forming raw material gas into said film-forming chamber; and a temperature controlling means for heating and/or cooling said web member, wherein a deposited film is continuously formed on the surface of said web member which is exposed to said microwave plasma, an improvement characterized in that a magnetic member is disposed to be in contact with the face of the web member opposite the face thereof which is exposed to the microwave plasma by virtue of the magnetic force, said magnetic member being provided with a temperature controlling mechanism capable of heating and/or cooling the web member.

Seventh Embodiment

In the apparatus for continuously forming a functional deposited film on a continuously moving web member by a microwave plasma CVD process, said apparatus comprising a substantially enclosed columnar film-forming chamber having a curved circumferential wall formed by curving and projecting said web member on the way of said web member to be moving in the longitudinal direction by means of supporting and transporting means; means for maintaining the inside of said film-forming chamber substantially in a vacuum state; a microwave coaxial line capable of supplying a microwave power in order to produce plasma in said film-forming chamber; a central conductor isolation means constituted by a material capable of transmitting said microwave power supplied from said microwave coaxial line, said central conductor isolation means being capable of isolating the central conductor of said microwave coaxial line from a film-forming raw material gas; means for exhausting the inside of said film-forming chamber; and means for introducing said film-forming raw material gas into said film-forming chamber, wherein a deposited film is continuously formed on the surface of said web member which is exposed to said microwave plasma, an improvement characterized in that a magnetic member is disposed to be in contact with the face of the web member opposite the face thereof which is exposed to the microwave plasma by virtue of the magnetic force, said magnetic member being provided with a temperature controlling mechanism capable of heating and/or cooling the web member.

Eighth Embodiment

A modification of each of the fifth to seventh embodiments, characterized in that a bias voltage applying means capable of controlling the potential of the microwave plasma is disposed.

As is apparent from the above described embodiments of the present the present invention lies in that as for the film-forming chamber the circumferential wall of which being comprised of the curved continuously moving web member, the magnetic body member (that is, the magnetic pressing member) provided with a mechanism having a function of transporting the web member while pressing it and capable of controlling the temperature of the web member is disposed to be in contact with the exterior face of the circumferential wall so that the circumferential wall is prevented from being deformed by controlling the temperature of the circumferential wall as well as airtightness of the film-forming chamber is ensured. By this, the foregoing problems in the prior microwave plasma CVD apparatus are prevented from occurring. In addition to this, the web member is smoothly transported while maintaining the transportation speed thereof at a desired value, and because of this, the productivity of a film product is improved.

Specifically, as described above, the curved continuously moving web member, which constitutes the circumferential wall of the film-forming chamber, is always contacted with the constituent members of opposite side walls of the film-forming chamber by virtue of the above magnetic body member wherein the entire of the web member is constantly maintained at a prescribed temperature, and because of this, such localization in temperature distribution at the web member as found in the prior microwave plasma CVD apparatus does not occur and thus, there is no occasion for the film-forming chamber to be deformed. As a result, discharge is always stably caused to constantly generate desirable plasma in the film-forming chamber. By this, a desirable film of uniform thickness and having a uniform film property is stably and continuously formed on the inner face of the film-forming chamber. In addition, since the magnetic body member has the transportation function, the transportation of the web member constituting the circumferential wall of the film-forming chamber is more efficiently performed and because of this, the period of time during which the web member is exposed to the plasma is maintained constant. By this, there is obtained a desirable film product which is uniform in film property. Further in addition, as described above, since desirable discharge is caused in the film-forming chamber, the utilization efficiency of a raw material gas is further improved. Further, even in the case where the gas pressure in the film-forming chamber should be changed, the shape of the inside of the film-forming chamber is stably maintained without being deformed and because of this, no abnormality occurs in the discharge. Thus, according to the present invention, a high quality deposited film may be continuously formed over a long peri od of t ime without suspending the discharge. For instance, a high quality stacked semiconductor device excelling in interface characteristics may be continuously produced. It is a matter of course to say that generation of polysilane powder, polymerization of active species, and the like are effectively prevented from occurring in the present invention.

DESCRIPTION OF THE PREFERRED EMBODIMENTS

In the following, the present invention will be described in more detail with reference to t he drawings, but the invention is not restricted by these descriptions.

FIG. 12 is a schematic diagram of the magnetic body member which is the principal feature of the present invention. Numeral reference 106 denotes a magnetic body member disposed at the exterior face of a film-forming chamber the circumferential wall of which being constituted by a curved continuously moving web member 101 such that it serves to pressingly transport the web member 101 by virtue of the magnetic force and the pressing force thereof as well as the temperature of the web member can be controlled. The magnetic body member 106 has at least a surface portion composed of a magnetic material and Is provided with a temperature controlling mechanism in the inside thereof as will be under described.

The magnetic body by which the magnetic body member 106 is constituted can include permanent magnets of rare earth elements, ferrite series permanent magnets, alnico series permanent magnets, Fe—Cr—Co series permanent magnets, and the like. In t he present invention, the magnetic body member is disposed to be directly, or indirectly through a permeable material, in contact with the exterior face of the circumferential wall comprising the curved moving web member 101 of the film-forming chamber. As for the drive of the magnetic body member 106, it is possible to rotate the magnetic body member 106 by virtue of the frictional force with the web member 101 without providing the magnetic body member 106 itself with a driving force. However, this is not recommended in view of incidental factors such as a reduction in the transportation speed of the web member 101, necessity of a raise in the power required for taking up the web member, and occurrence of stretches in the web member due to the rise in the power required for taking up the web member 101. In a preferred embodiment, driving force is provided to the magnetic body member 106 by means of a driving source and the magnetic body member 106 is rotated while matching the driving speed for the magnetic body member 106 with the transportation speed of the web member 101 which is transported by means of a different driving source.

In the case of FIG. 12, there are illustrated three magnetic body members 106. But the number of the magnetic body members to be disposed is not limited to only three. That is, the number of the magnetic body members to be disposed should be properly determined depending upon the related factors such as the magnitude of the diameter of the film-forming chamber formed of the web member 101, the transportation speed of the web member, the thermal conductivity of the web member, the film formation temperature and the like. For instance, in the case where a web member made of stainless steel of SUS430LX is used as the web member 101 and the size of the film-forming chamber is made to be 10 cm to 70 cm in diameter, there are used 3 to 20 magnetic body members of 3 cm to 6 cm in diameter.

FIG. 12 schematically illustrates the case where the web member 101 is curved concentrically along the exterior face of an isolation means 109 for isolating a microwave applicator from microwave plasma. Herein, a metal mesh member 502 or 502' capable of confining microwave plasma region is mounted to each of the two side faces where supporting and transporting rings 104 and 105 are disposed (only one side is shown in the figure). Numeral reference 202 denotes a circular waveguide provided with an aperture 208 for supplying microwave. Each of numeral references 102 and 103 denotes a supporting and transporting roller. Numeral reference 112 denotes a gas feed pipe. In the case of FIG. 12, as the microwave applicator, there is used a planar type microwave applicator capable of radiating microwave energy with a directivity in one direction perpendicular to the direction of microwave propagation and introducing said microwave energy into the film-forming chamber. It should be understood that the microwave applicator to be used is not limited to only this planar type microwave applicator but other than this, it may be a window type microwave applicator capable of radiating microwave energy in a direction in parallel to the direction of microwave propagation and introducing said microwave energy into the film-forming chamber or a coaxial type microwave applicator capable of radiating through a microwave antenna microwave energy in all directions perpendicular to the direction of microwave propagation and introducing said microwave energy into the film-forming chamber. In any of these latter cases, the foregoing magnetic body members 106 may be used in the same manner as in the above. As for the temperature controlling mechanism provided at the magnetic body member 106, it may be designed so that the magnetic body member is a conduit structure through which a temperature controlling medium is circulated. Alternatively a heater is embedded in the magnetic body member. The temperature controlling medium can include air, water, oil, Freon, etc.

The constitution shown in FIG. 11 is the same as that shown in FIG. 12, except for the position of the microwave applicator which is different and an independent magnetic body member 107 is disposed in addition to the magnetic body members 106 in the former. FIG. 11 schematically illustrates the case where the web member is curved in a substantially columnar form on the side opposite to the direction toward which the aperture 208 provided at the circular waveguide 202 while closing to the exterior face of the isolation means 109 at two positions. In FIG. 11, each of numeral references 102 and 103 denotes a supporting and transporting roller. Each of numeral references 104 and (105) denotes a supporting and transporting ring.

The width of each of the supporting and transporting rings 104 and (105) is desired to be as small as possible in the ratio to the width of the web member used in order to attain a high utilization efficiency of the web member for forming a deposited film thereon, since a film is also deposited on these rings 104 and (105). The side face of each of the supporting and transporting rings 104 and (105) is desired to be provided with a metal mesh member or a metal mesh thin plate 501 or 501' capable of confining microwave plasma region (only one side is shown in the figure). The mesh size is desired to be preferably less than ½ or more preferably less than ¼ of the wavelength of microwave used. In the case where gas is exhausted through this face, the mesh size should permit the gas to pass therethrough.

The magnetic body member 107 serves to supplement the magnetic force to support the web member 101 when the magnetic body member 106 is demagnetized due to direct contact thereof with the web member. The magnetic body member 107 may be provided with a temperature controlling means such that said temperature controlling means supplements the temperature controlling function of the magnetic body member 106. Further, it is possible to provide a columnar and rotatable cooling member made of a permeable material (not shown in the figure) between the magnetic body member 107 and the web member 101. For instance, the rotatable cooling member (not shown in the figure) may be designed either such that it rotates by virtue of the frictional force with the web member 101 without relying upon a driving force or such that it rotates by means of a driving source provided therefor.

The present invention will be described in more detail with reference to the following apparatus embodiments while referring to the drawings, but the present invention is not restricted by these embodiments.

Apparatus Embodiment 1(A)

FIG. 1(A) is a schematic diagram illustrating an embodiment of the microwave plasma CVD apparatus according to the present invention.

Numeral reference 101(A) denotes a web member. The web member is continuously moved in the direction expressed by an arrow while forming and maintaining a columnar-like curved shape to provide a film-forming chamber 116(A) by means of supporting and transporting rollers 102(A) and 103(A) and supporting and transporting rings 104(A) and 105(A). Numeral reference 106 denotes magnetic body rollers respectively as the foregoing magnetic body member. The magnetic body rollers are arranged on the exterior face of the film-forming chamber 116(A) the circumferential wall of which comprising the curved continuously moving web member 101(A) such that they transport the web member 101(A) while pressing it by virtue of their magnetic force and pressing force. The temperature of the web member 101(A) can be controlled by them. At least a surface portion of the magnetic body rollers 106 is constituted by a magnetic material and have a temperature controlling mechanism therein. Each of the magnetic body rollers is designed so that it can independently operate to perform temperature control.

In the apparatus of this embodiment, a pair of microwave applicators 107(A) and 108(A) are provided opposite to each other, and their end portion is provided with a microwave transmissive member 109(A) or 110(A). Rectangular waveguides 111(A) and 112(A) are oppositely arranged through the film-forming space such that each face containing the long edge of one of them is not perpendicular to each face containing the central axis of one of the supporting and transporting rollers in the film-forming space and that the face containing the long edge of one of the waveguides is not in parallel to the face containing the long edge of the other waveguide. In FIG. 1(A), for simplification purposes, the microwave applicator 107(A) is shown in a state separated from the supporting and transporting ring 104(A), but it is actually arranged at the position expressed by an arrow.

Numeral reference 113(A) denotes a gas feed pipe. Numeral reference 114(A) denotes an exhaust pipe which is connected to an exhaust pump (not shown in the figure). Numeral reference 115(A) denotes an isolated passage for use in the case where the apparatus of the present invention is connected to other reaction chamber containing film-forming means.

Each of the supporting and transporting rollers 102(A) and 103(A) contains a transportation speed detecting mechanism and a tensible strength detecting mechanism (these mechanisms are not shown in the figure) for detecting and controlling the transportation speed and the tensible strength in order to maintain the transportation speed of the web member 101(A) constant and maintain the curved shape in a desired state.

A microwave power source (not shown in the figure) is connected to each of the waveguides 111(A) and 112(A).

Shown in FIG. 4 is a schematic cross-sectional view for illustrating the constitution of the microwave applicator 107(A) or 108(A) used in the apparatus shown in FIG. 1(A).

Numeral reference 200 (A) denotes a microwave applicator, wherein microwave from a microwave power source (not shown in the figure) transmits in the direction expressed by an arrow through a rectangular waveguide 208(A). Microwave transmissive members 201(A) and 202(A) are respectively fixed to an inner cylinder 204(A) and an outer cylinder 205(A) by means of a metal sealing member 212 and a fixing ring 206(A). The space between the inner cylinder 204( A) and the outer cylinder 205(A) is so structured that a cooling medium 209(A) flows therein. One end of the space is sealed by an O-ring 210(A). By this, the entire of the microwave applicator 200(A) can be cooled. The cooling medium 209(A) can includes water, Freon, oil, cooled air, etc. The microwave transmissive member 201(A) is provided with a pair of microwave matching circular plates 203(A) thereon. A choke-flunge 207(A) having a channel 211(A) is connected to the outer cylinder 205(A). Numeral references 213(A) and 214(A) denote holes respectively for circulating cooled air into the inside of the microwave applicator to cool said inside.

In the apparatus of this embodiment, the inside shape of the inner cylinder 204(A) is cylindrical. The inside diameter an d the inside length in the direction of microwave propagation of the inner cylinder are properly determined such that the inside can function as the waveguide. Particularly, it is desired for said inside diameter to be designed such that the out-off frequency becomes smaller than the frequency of microwave used but large as much as possible as long as a plurality of modes are not be established therein. As for said inside length, it is desired to be designed such that a standing wave is not provided therein. The inside shape of the inner cylinder 204(A) is not limited to the cylindrical shape but it may be of a prismatic shape.

In the apparatus of this embodiment, it is possible to dispose a bias voltage applying means in a state that it is electrically isolated from the web member 101. In this case, the formation of a deposited film may be performed while controlling the potential of microwave plasma by applying a desired bias voltage through the bias voltage applying means.

The bias voltage applying means is desired to be disposed such that at least part thereof contacts with microwave plasma generated and a predetermined bias voltage can be applied through the bias voltage applying means. At least the portion of the bias voltage applying means to be in contact with the microwave plasma is applied with conductive treatment so as to permit the application of a bias voltage therethrough. The bias voltage applied may be of direct current, pulsating current, alternate current, or combination of these.

The bias voltage applying means in the apparatus in this embodiment may be designed so as to serve also as the gas feed means 113(A). It is may be arranged independently from the gas feed means. The bias voltage applying means may comprise a single bias bar or a plurality of bias bars.

Alternatively, it is possible to control the potential of microwave plasma by applying a desired bias voltage through the web member. In this case, the gas feed means is electrically grounded and at least part thereof is designed to be in contact with the microwave plasma. And at least part of the gas feed means to be in contact with the microwave plasma is applied with conductive treatment.

Apparatus Embodiment 1(B)

FIG. 1(B) is a schematic diagram illustrating another embodiment of the microwave plasma CVD apparatus according to the present invention.

Numeral reference 101(B) denotes a web member. The web member is continuously moved in the direction expressed by an arrow while forming and maintaining a columnar-like curved shape to provide a film-forming chamber by means of supporting and transporting rollers 102(B) and 103(B) and supporting and transporting rings 104(B) and 105(B). Numeral reference 106 (B) denotes magnetic body rollers respectively as the foregoing magnetic body member. The magnetic body rollers are arranged on the exterior face of the film-forming chamber 116(B) the circumferential wall of which comprising the curved continuously moving web member 101(B) such that they transport the web member 101(B) while pressing it by virtue of their magnetic force and pressing force and the temperature of the web member 101(B) can be controlled by them. The magnetic body rollers 106 (B) are such that at least their surface portion is constituted by a magnetic material and have a temperature controlling mechanism therein. Each of the magnetic body rollers is so designed that it can independently operate in order to perform the temperature control. Numeral reference 108(B) denotes a microwave applicator, which is encapsuled in an isolation means 109(B) so that said microwave applicator is isolated from microwave plasma region 113(B). Numeral reference 110(B) denotes a microwave-leakage prohibiting metal cylinder, numeral reference 111(B) denotes a microwave-leakage prohibiting metal mesh member, and numeral reference 112(B) denotes a gas feed pipe. Each of numeral references 114(B) and 115(B) denotes a microwave-leakage prohibiting metal mesh member. The microwave plasma region 113(B) is confined within the film-forming chamber the circumferential wall of which comprising the curved moving web member 101(B). The inside of the region where microwave plasma is generated is exhausted through the space provided between the isolation means 109(B) and the supporting and transporting rollers 102(B) and 103(B) or/and through the microwave-leakage prohibiting metal mesh members 114 (B) and 115(B) using an exhaust device (not shown in the figure).

Shown in FIG. 5 is a schematic explanatory view of the constitution of a microwave applicator means 201 (B) to be used as the above microwave applicator 108(B). Numeral reference 202(B) denotes a circular waveguide having an end portion 203(B) and having a plurality (for example, 5) of apertures 204(B) to 208(B) being spacedly formed through one side face thereof. Microwave transmits in the direction expressed by an arrow. The figure shows an embodiment wherein a microwave shutter means which is operatively provided to the waveguide 202(B) only for the aperture 204(B) such that it can block or unblock said aperture. By blocking or unblocking one or more apertures in this way, unification of microwave energy radiated in the lengthwise direction of the waveguide 202(B) can be attained.

Apparatus Embodiment 1(C)

FIG. 2 is a schematic diagram illustrating a further embodiment of the microwave plasma CVD apparatus according to the present invention.

In the figure, 101 is a web member, 102 is a coaxial line capable of supplying microwave, that is, an antenna, 103 is a dielectric pipe made of a microwave transmissive material, 104 is a film-forming chamber, 105 are small apertures, and 106 are magnetic body rollers respectively of the same constitution as that described in Apparatus Embodiment 1. Numeral reference 107 denotes an exhaust port, numeral reference 108 denotes a web member-supporting roller, numeral reference 109 denotes a gas feed pipe, numeral reference 110 denotes a slit-like opening of the film-forming chamber, and reference numeral 111 denotes a roller for supporting the opening.

Apparatus Embodiment 2

This embodiment is of an apparatus comprising the apparatus described in Apparatus Embodiment 1(B) placed in an isolation vessel. Shown in FIG. 5 is a schematic diagram of the apparatus. Numeral reference 400 denotes an isolation vessel. The inside thereof can be vacuumed through an exhaust port using an exhaust pump (not shown). Numeral references 401 and 402 denote fixing flanges to fix an isolation means being projected while passing through the opposite side walls of the isolation vessel 400. Not only the isolation vessel 400 but also the fixing flanges 401 and 402 are desired to be made of a corrosion resistant material such as stainless steel. It is desired for these fixing flanges to be disconnectably arranged to the isolation vessel 400. The fixing flange 401 is fixed to a connection flange 404. The connection flange 404 is directly fixed to the circumferential wall of the isolation vessel 400. Herein, there is provided a spacing 405 with a spread of being substantially the same as the exterior face of the isolation means 109 in the form of a cylindrical shape so that the isolation means 109 can be inserted therethrough. The fixing flange 401 is provided with a pair of O-rings 406 and 407 such that said pair of O-rings are hermetically compressed against the exterior of the isolation means so as to insure air tight seal of the inside of the isolation vessel 400. There is provided a cooling channel 408 between the O-rings 406 and 407. A cooling medium such as water is circulated through the cooling channel to uniformly cool the O-rings 406 and 407. Each of the O-rings is made of an appropriate material which is highly heat resistant to a temperature of more than 100° C. such as VITON, etc. The O-rings are desired to be arranged at the position which is sufficiently apart from the microwave plasma region, in order to prevent them from being damaged due to high temperature.

Numeral reference 110 denotes a metal cylinder, and a metal mesh member 111 is fixed to open end portion 409. The metal cylinder is provided with a grounding finger 410 through which the metal cylinder is electrically contacted with the fixing flange 401. This results in preventing microwave energy from leaking to the outside. The metal mesh member III in this case also functions to allow flow of cooling air into the isolation means 109, whereby cooling said isolation means. It is possible to connect a dummy load for absorbing microwave energy to the open end portion 409. This is effective particularly in the case where leakage of microwave energy with a high power level occurs.

As above described, the isolation vessel 400 is provided with the fixing flange 402 which is fixed to the side wall opposite the side wall to which the fixing flange is fixed as well as in the case of the isolation means.

Numeral reference 411 denotes a connection flange, numeral reference 412 denotes an open portion, each of numeral references 413 and 414 denotes an 0-ring, numeral reference 415 denotes a cooling channel, numeral reference 416 denotes a metal cylinder, and numeral reference 417 denotes a grounding finger. Numeral reference 418 denotes a connection plate which serves to connect the microwave applicator 108 to a mode converting waveguide 403 capable of converting the mode of a rectangular waveguide into the mode of a circular waveguide. The structure in this case is desired to be made such that leakage of microwave energy does not occur. As such structure, there can be mentioned choke flange and the like. The mode converting waveguide 403 is connected to a rectangular waveguide 421 through a connection flange 420.

Apparatus Embodiment 3

This embodiment is an apparatus comprising the apparatus shown in FIG. 1(B) which is provided with a microwave applicator means shown in FIG. 6.

Numeral reference 302 denotes a circular waveguide having an open end portion 303 and a single elongated, rectangular aperture 304. In the figure, microwave transmits in the direction expressed by an arrow. The aperture 304 is larger than one wavelength of the microwave used, and formed through substantially the entire length and with dimension of one face of the circular waveguide 302. The open end portion 303 is adapted to avoid occurrence of standing waves. However a sealed end portion may be employed for a given application. The microwave applicator means thus configured allows microwave energy to radiate from the entire aperture 304. The concentration of microwave energy becomes greatest at the end of the aperture situated nearest to the microwave power source.

However, it is possible to regulate the concentration of the microwave energy by employing at least a microwave shutter 306 operatively fixed to the waveguide 302 by a single connection 305. The microwave shutter 306 is desired to take such forms as shown in FIGS. 7 to 9, particularly the form of a strip shape, a trapezoidal shape or a half moon-like cut strip or trapezoidal shape.

The connection portion 305 consists of a fixing pin 308 through a channel 307 of the microwave shutter 306 on the side of the waveguide nearest to the microwave power source. Disposed at the opposite end of the aperture 304, and along the edges of said aperture, are dielectric insulators 309 made of glass or teflon. These are adapted in order to contact the microwave shutter 306 with the waveguide 302 only at the connection portion 305. In the case where a contact is disposed between part of the microwave shutter 306 and waveguide 302, this will cause an arcing contact.

Apparatus Embodiments 4 and 5

There are mentioned the apparatus described in Apparatus Embodiment 1(B) and the apparatus described in Apparatus Embodiment 2, in each of which the web member 101 and the isolation means 109 are arranged as shown in the cross sectional view of FIG. 12.

The arrangement in the figure illustrates the case where the web member 101 is concentrically curved along the exterior face of the isolation means 109. Herein, the side face of each of the supporting and transporting rings 104 and 105 is desired to be provided with a metal mesh member 501 or 5011 capable of confining the microwave plasma region (only one side is shown in the figure). The mesh size is desired to be preferably less than ½ or more preferably less than ¼ of the wavelength of microwave used. In the case where gas is exhausted through this face, the mesh size should permit the gas to pass therethrough. As for the crosswise width of the spacing $L_4$ provided between the curving initiation portion and the curving termination portion of the web member, it is necessary to be a width of less than ½ of one wavelength of the microwave radiated in order to prevent microwave energy from leaking therefrom and in order to confine the microwave plasma region within the columnar space.

The relative arrangement of the web member 101 to the isolation means 109 is desired to be concentric as described above, but it can be varied as long as the isolation means 109 is situated in the columnar space while being encapsulated therein and the microwave energy radiated is confined within the columnar space. There is not any particular restriction for the direction of the opening of the aperture 208 of the microwave applicator means. The gas feed pipe 112 is desired to be arranged in the space circumscribed by the isolation means 109 and the web member 101.

Apparatus Embodiments 6 and 7

There are mentioned two apparatus respectively comprising the apparatus described in Apparatus Embodiment 4 and the apparatus described in Apparatus Embodiment 5, in each of which the microwave applicator 201 is replaced by the microwave applicator used in Apparatus Embodiment 2.

Apparatus Embodiments 8 to 11

There are mentioned four apparatus respectively comprising the apparatus described in Apparatus Embodiment 1(B), the apparatus shown in Apparatus Embodiment 2, the apparatus shown in Apparatus Embodiment 4 and the apparatus shown in Apparatus Embodiment 5, in each of which the microwave applicator 201 is replaced by a slow microwave structure microwave applicator (not shown).

Apparatus Embodiment 12

There is mentioned an apparatus comprising the microwave plasma CVD apparatus for the formation of a deposited film described in Apparatus Embodiment 10r 2 to which a vacuum chamber 701 for paying out the web member 101 and another vacuum chamber 702 for taking up the web member are connected using gas gates 721 and 722 as shown in FIG. 15 or FIG. 16.

Numeral reference 703 denotes a pay-out reel for paying out the web member, and numeral reference 704 denotes a take-up reel for taking up the web member. The web member is transported in the direction expressed by an arrow in each of the figures. It is possible for the web member to be transported in the reverse direction. Each of numeral references 705 and 706 denotes a transportation roller capable of also serving to adjust the tensile force and adjust the position of the web member. Each of numeral references 712 and 713 denotes a temperature controlling mechanism for heating or cooling the web member. Each of numeral references 707, 708 and 709 denotes a slot valve for regulating the exhausting degree. Each of numeral references 710, 711 and 720 denotes an exhaust pipe which is connected to an exhaust pipe (not shown). Each of numeral references 714 and 715 denotes a pressure gauge, each of numeral references 716 and 717 denotes a gate gas supply pipe, and each of numeral references 718 and 719 denotes an exhaust pipe for exhausting a gate gas and sometimes, a film-forming raw material gas by means of an exhaust pump (not shown). Numeral reference 723 denotes a film-forming chamber the circumference of which comprising the web member 101.

Apparatus Embodiment 13

There is mentioned an apparatus comprising the apparatus described in Apparatus Embodiment 12 and two isolated vessels 400-a and 400-b respectively housing the microwave plasma CVD film-forming apparatus of the present invention in which the two vessels are arranged on the opposite sides as shown in FIG. 17(A). This apparatus is suitable for continuously preparing a multi-layered device.

In the figure, the constituents added with reference a and reference b are substantially the same as those employed in the isolated vessel 400.

Numeral references 801, 802, 803 and 804 respectively denote a gas gate, numeral references 805, 806, 807, and 808 respectively denote a gate gas supply pipe, and numeral references 809, 810, 811 and 812 respectively denote a gate gas exhaust pipe.

Apparatus Embodiments 14 and 15

There are mentioned an apparatus comprising the apparatus described in Apparatus Embodiment 12 and an apparatus comprising the apparatus shown in Apparatus Embodiment 13, in each of which the microwave applicator 301 used in Apparatus Embodiment 3 is used instead of the microwave applicator 201.

Apparatus Embodiment 16 and 17

There are mentioned an apparatus comprising the apparatus shown in Apparatus Embodiment 12 and an apparatus comprising the apparatus shown in Apparatus Embodiment 13, in each of which a slow microwave structure microwave applicator is used instead of the microwave applicator 201.

Apparatus Embodiment 18

There is mentioned an apparatus comprising the apparatus described in Apparatus Embodiment 12 and two conventional RF plasma CVD apparatus being disposed on the opposite sides as shown in FIG. 18. This apparatus is suitable for continuously preparing a multi-layered device.

In the figure, numeral references 901 and 902 respectively denote a vacuum vessel, numeral references 903 and 904 respectively denotes a RF applying cathode electrode, numeral references 905 and 906 respectively denote a gas feed pipe capable of serving also as a heater, numeral references 907 and 908 respectively denote a halogen lamp for heating the substrate, numeral references 909 and 910 respectively denote an anode electrode, and numeral references 911 and 912 respectively denote an exhaust pipe.

Apparatus Embodiment 19

There is mentioned an apparatus shown in FIG. 17(B). The apparatus is of the same constitution as that of the apparatus shown in FIG. 17(A) except that the planar type microwave applicator means in FIG. 17(A) is replaced by the coaxial type microwave applicator using a microwave antenna shown in FIG. 2. In FIG. 17(B), numeral reference 120 denotes an antenna capable of transmitting microwave, and no gas feed pipe is shown.

Other Apparatus Embodiments (1) Modifications of the apparatus described in Apparatus Embodiment 13 wherein each of the isolated vessels 400, 400-*a* and 400-*b* is provided with a different microwave applicator selected those previously described.

(2) Modifications of the apparatus described in Apparatus Embodiment 13 wherein the three chambered unit is repeated twice or three times, or the three chambered unit containing a RF plasma CVD chamber is repeated.

(3) A modification of the apparatus described in Apparatus Embodiment 12 or 13, wherein the arrangement of the microwave applicator to the web member is made in the same way as in Apparatus Embodiment 4 or 5.

In the present invention, the film-forming raw material gas introduced into the columnar film-forming chamber through the gas feed pipe is partly or entirely decomposed to produce precursors thereby causing the formation of a deposited film. Both the raw material gas which is not decomposed and gas having a resulting different composition must be quickly exhausted outside the columnar film-forming chamber. However, when the area of the exhaust port is made too large, microwave energy is apt to leak through such exhaust port, resulting in unstable plasma and providing adverse effects to other electronic devices, and the human body, etc. In view of this, it is necessary to provide an exhaust port having the following features. That is, (1) a mesh member or a punching board is provided at the side end face of each of the opposite supporting and transporting rings used for curving the web member such that gas is permitted to exhaust therethrough but microwave is prohibited from leaking therethrough. The mesh size of the mesh member or the size of the perforation of the punching board is such that a pressure difference is caused between the pressure in the inside of the columnar film-forming chamber and that outside the columnar film-forming chamber. Particularly, it is desired that the largest size of the aperture is preferably less than ½ or more preferably less than ¼ of the microwave used and the numerical aperture is preferably less than 80% or more preferably less than 60%. In this case, gas exhaustion may be conducted also through the spacing provided between the curving initiation portion and the curving termination portion of the web member or the spacing (slit) provided between the exterior face of the isolation means and the curving initiation and termination portions. The spacing in any case is desired to be preferably ½, or more preferably less than ¼, of the microwave used in order to prevent microwave from leaking therethrough. (2) A thin plate is provided at the side end face of each of the opposite supporting and transporting rings used for curving the web member such that no gas is exhausted therethrough and microwave cannot leak therethrough. Gas exhaustion is conducted only through the spacing provided between the curving initiation portion and the curving termination portion of the web member or the spacing (slit) provided between the exterior face of the isolation means and the curving initiation and termination portions. The spacing in any case is desired to be preferably ½, or more preferably less than ¼, of the microwave used in order to prevent microwave from leaking therethrough. (3) One selected from the mesh member, punching board and thin plate described in the above (1) and (2) is provided at the side end face of each of the opposite supporting and transporting rings used for curving the web member. This arrangement is of the combination of arangements described in the above (1) and (2). Any of the mesh member, punching board and thin plate is desired to be made of the same material as the constituent material of the supporting and transporting rings or to be applied with the same surface treatment as that applied to the supporting and transporting rings.

The isolation means in the present invention is disposed in close proximity to or in the film-forming chamber. The isolation means is the structure in which the microwave applicator means capable of radiating or transmitting microwave energy in the film-forming chamber is encapsulated. The isolation means is structured such that it isolates the vacuum atmosphere in the film-forming chamber from outside air where the microwave applicator is situated and it withstands a pressure difference between the inside pressure and the outside pressure. The shape thereof is desired to be cylindrical or semi-cylindrical. Other than these shapes, it may be shaped such that it has a smoothly curved surface as a whole.

In the case where the isolation means is in the form of a cylindrical or semi-cylindrical shape, it is desired for the diameter there of to be minimized as much as possible in the range of allowing the microwave applicator means to be encapsulated in the inside while not being in contact with the inner face.

Further, as for the isolation means, the side end portion opposite to the side through which the microwave applicator means is inserted is desired to be provided with an appropriate microwave confining means or a dummy load.

In the former alternative, portions projected from the side en d portion of th e web member are desired to be substantially covered by a conductive material such as metal member, metal mesh member or the like and electrically grounded. If there is a fear to cause negative influences on the matching of microwave at a high power level, the latter alternative is effective in order to avoid occurrence of such problem.

For security purposes, as for the isolation means, portions projected from the side through which the microwave applicator means is inserted are desired to be covered by a conductive material such as metal member, metal mesh member or the like and electrically grounded to the waveguide or the isolated vessel.

The microwave applicator means in the present invention has such a structure that functions to radiate microwave energy supplied from the microwave power source into the film-forming chamber in a desirable state, whereby decomposing a film-forming raw material gas supplied from the gas feed means to constantly generate and maintain plasma in a desirable state. Specifically, a waveguide having an open end is desirably used. Examples of such waveguides, include microwave transmitting waveguides such as circular waveguide, rectangular waveguide, elliptic waveguide, etc. By making the waveguide have an open end, a standing wave is prevented at the terminal portion of the waveguide. The remaining end of the waveguide may be in a closed state, wherein no obstacle is entailed.

In the apparatus of the present invention, as for the size of the circular waveguide to be preferably used in the microwave applicator means, it should be decided depending upon the frequency band and the propagating mode of the microwave used.

As for the kind of the rectangular waveguide to be preferably used in the microwave applicator means in the present invention, it should be determined depending upon the frequency band and the propagating mode of the microwave used. Its cut-off frequency is desired to be smaller than the frequency used.

In the apparatus of the present invention, a gas gate means is desirably used in order to make each of the film-forming chamber or the isolated vessel and the vacuum vessel provided with the film-forming means to be independent one from the other through vacuum atmosphere and to continuously transport the web member while passing it through these chambers. In the apparatus of the present invention, the inside of the film-forming chamber or the isolated vessel is maintained at a pressure required for the performance near the minimum value of the modified Pashen's curve. Therefore, the inside pressure of other vacuum vessels connected to the film-forming chamber or the isolated vessel of the present invention often becomes equivalent or superior to that of the film-forming chamber or the isolated vessel of the present invention. Thus, it is required that the gas gate means functions to prevent a film-forming raw material gas in one vacuum vessel from dispersing into the other vacuum vessel. In order to design the gas gate means so as to satisfy this requirement, the principle of a gas gate means described in U.S. Pat. No. 4,438,723 may be employed. The capacity thereof must be improved. The gas gate means is required to stand against a pressure difference of about $10^6$ fold. An exhaust pump having a high exhausting capacity such as oil diffusion pump, turbomolecular pump, mechanical booster pump, etc is used. As for the cross-section form of the gas gate means, it is desired to be in the form of a slit or the like form. The scale thereof is properly designed based on the results obtained by a conventional conductance computation equation in connection with its full length and the exhausting capacity of the exhaust pump used. In order to sufficiently isolate one vacuum vessel from the other vacuum vessel, it is desired to use a gate gas. Such gate gas can include rare gases such as Ar, He, Ne, Kr, Xe, Rn, etc. and dilution gases used for film formation such as $H_2$. The flow rate of such gate gas should be decided depending upon the conductance of the entire gas gate and the exhausting capacity of the exhaust pump used, utilizing the pressure gradient shown in FIG. 13 or FIG. 14. In the case of FIG. 13 it is understood that the point where pressure becomes maximum is situated near the central part of the gas gate and thus, the gate gas dividedly flows from the central part toward the respective adjacent vacuum vessels positioned in the both sides. In the case of FIG. 14, it is understood that the point where pressure becomes a minimum is situated near the central part of the gas gate and thus, the gate gas is exhausted together with film-forming raw material gases from the adjacent vacuum vessels through the central part. In this connection, in each of the two cases, it is possible to prevent mutual dispersion of the gases used in the adjacent vacuum vessels. In practice, the optimum conditions are decided by measuring the amount of a gas to be dispersed by means of a mass spectrometer or by analyzing the composition of the resultant deposited film.

In the apparatus of the present invention, the film-forming means provided in other vacuum vessels than the film-forming chamber of the present invention can include means capable of forming a functional deposited film by a RF plasma CVD method, a sputtering method, a reactive sputtering method, an ion plating method, a light-induced CVD method, a thermally induced CVD method, a MO-CVD method, a MBE method or a HR-CVD method. It is also possible to employ a film-forming means by a microwave plasma CVD method similar to the microwave plasma CVD method employed in the present invention.

In the present invention, the frequency of microwave supplied from the microwave power source is preferably of 2.45 GHz employed in daily appliances but it is possible to use microwave of other easily accessible frequency. In order to attain stable discharge, the oscillation system is desired to be continuous oscillation. And its ripple width is desired to be preferably within 30% or more preferably, within 10% in the use output region.

In the present invention, to continuously conduct the formation of a deposited film without exposing the film-forming chamber or the isolated vessel to the open air is desired in order to make the resul ting deposited film stable in view of film property and in order to prevent the resulting deposited film from being contaminated with foreign matters. However, there is a limit for the length of the web member used. It is therefore necessary to connect a new web member to the previously used web member by an appropriate connecting means such as welding technique. This can be carried out, for example, in a processing chamber arranged next to the chamber containing the web member, wherein said processing chamber is disposed on the paying-out side and on the taking-up side.

In the following, explanation will be made of the processing of the web member in the case where the processing chamber is disposed next to the chamber containing the web member with referenece to the drawings.

FIG. 23 through FIG. 32 are respectively schematic views for illustrating the outline of the web member processing chamber and the performance of the web member upon film formation.

In FIGS. 23 to 32, 1201$a$ represents a web member processing chamber (A) disposed on the side of delivering a web member and 1201*b* represents a web member processing chamber (B) disposed on the side of taking-up the web member, in which are contained a pair of rollers 1207*a*, 1207*b*, made of a VITON, a pair of cutting blades 1208*a*, 1208*b* and a welding jig 1209*a*, 1209*b*.

That is, FIG. 23 shows a state of the usual film-formation, in which the web member 1202 is moving in the direction of an arrow, and the rollers 1207*a*, the cutting blades 1208*a* and the welding jig 1209*a* are not in contact with the web member 1202. Numeral reference 1210 represents a connection means (gas gate) with an initial substrate web container (not shown). Numeral reference 1211 represents a connection means (gas gate) with a vacuum chamber (not shown).

FIG. 24 shows a first step for replacing with a new web member after the completion of the film formation for one roll of the web member. At first, the web member 1202 is stopped, and the rollers 1207*a* are moved from the positions shown by the dotted lines along the directions of arrows shown in the figure, and brought into closely contact with the web member 1202 and the wall of the web member processing chamber 1201*a*. In this state, the Initial web member container and the film-forming chamber are separated in a gas sealed manner of operating the gas gate. Then, the cutting blades 1208*a* are operated in the directions of arrows to cut the web member 1202. The cutting blades 1208*a* are constituted so as to mechanically, electrically or thermally cut the web member 1202.

FIG. 25 shows a state in which the cut and separated web member 1203 is taken up on the side of the web member container.

The above cutting and taking-up steps can be conducted in the inside of the web member container under a vacuum state or under a state of leaking to atmospheric air.

FIG. 26 shows a step in which a new web member 1204 is supplied and connected with the former web member 1202. The web members 1204 and 1202 are brought into contact at their ends and then connected by way of welsion using the welding jig 1209*a*.

FIG. 27 shows a state in which the inside of a web member container (not shown) is evacuated to reduce the pressure difference relative to the film-forming chamber sufficiently and, thereafter, the rollers 1207*a* are separated from the web member 1202 and the wall of the web member processing chamber (A) 1201*a*, and the web members 1202 and 1204 a re taken up.

Next, description will be made of the operation on the side of taking up the web member.

FIG. 28 shows a usual film-forming state, in which the respective jigs are disposed substantially in symmetry with those described in FIG. 23.

FIG. 29 shows a step for taking out one roll of a web member after the completion of the film formation therefor, and placing an empty bobbin for taking up the web member applied with the subsequent film-forming step.

At first, the web member 1202 is stopped, and the rollers 1207*b* are moved from the positions shown by the dotted lines along the directions of arrows shown in the figure and are brought into close contact with the web member 1202 and the wall of the web member processing chamber 1201*b*. In this state, the foregoing terminal web member container and the film-forming chamber are separated in a gas tight manner of operating the gas gate. Then, the cutting blades 1208*b* are moved in the directions of arrows to cut the web member 1202. The cutting blades 1208*b* are constituted with any one of those capable of mechanically, electrically or thermally cutting the web member 1202.

FIG. 30 shows the state in which a cut web member 1205 after the completion of the film-forming step is taken up on the side of the web member container.

The above cutting and taking-up steps may be conducted in the inside of the web member container under an evacuated state or under a state of leaking to atmospheric pressure.

FIG. 31 shows a step in which a stand-by web member 1206 wound on a new taking-up bobbin is supplied and connected with the substrate web 1202. The web member 1206 and the web member 1202 are in contact with each other at the ends thereof and then connected by way of welsion using the welding jig 1209*b*.

FIG. 32 shows a state in which the inside of the web member container (not shown) is evacuated to reduce the pressure difference with a film-forming chamber sufficiently and thereafter, the rollers 1207*b* are separated from the web member 1202 and the wall of the web member processing chamber (B) 1201*b*, and the web members 1202 and 1206 ar e being taken up.

In the present invention, it is difficult to establish the optimum condition which enables stably maintaining uniformity of microwave plasma on the basis of a single parameter, since the stability and uniformity of microwave plasma will be maintained in the complicated interrelated organic situation of a plurality of parameters such as the kind and shape of the microwave applicator used, the inner pressure of the film-forming chamber upon film formation, the microwave power, the degree of microwave plasma to be confined, the volume and shape of the discharge space, etc. However, there can be mentioned those condition ranges as will be under described.

As for the inner pressure of the film-forming chamber upon film formation, it is preferably from the range of 1 to 3 mTorr to the range of 200 to 500 mTorr or more preferably from the range of 3 to 10 mTorr to the range of 100 to 200 mTorr. As for the microwave power, it is preferably from the range of 300 to 700 W to the range of 300 to 5000 W or m ore preferably, from the range of 300 to 700 W to the range of 1500 to 3000 W. Further, as for the inside diameter of the curved columnar portion, it is desired to be of preferably about 5 fold or more preferably 4 fold over the length of the exterior face of the isolation means to be exposed to the microwave plasma region. Under these conditions, uniform microwave plasma is maintained in a substantially stable state.

In addition, in the case where the mass of microwave energy to be leaked from the microwave plasma region is great, the plasma becomes unstable. In order to avoid occurrence of this problem, the spacing provided between the curving initiation and termination portions of the web member or between these portions and the isolation means is desired to be preferably ½ or more preferably, ¼ of the wavelength of microwave.

As described above, as the magnetic body material by which the magnetic body member serving to press and transport the web member while controlling the temperature thereof, there can be mentioned permanent magnets of rare earth elements, permanent magnets of ferrite, permanent magnets of alnico, permanent magnets of Fe—Cr—Co, etc. In the case where the film formation is performed at a high temperature of 250° C. or above, it is desired to use a Fe—Cr—Co permanent magnet which is not demagnetized at such high temperature.

As the functional deposited film to be continuously formed in the present invention, there can be mentioned amorphous or crystalline semiconductor thin films including semiconductor thin films of Si, Ge, C, etc., semiconductor alloy thin films of SiGe, SiC, SiSn, etc., so-called III–V Group compound semiconductor thin films of GaAs, GaP, GaSb, InP, InAs, etc., and so-called II–VI Group compound semiconductor thin films of ZnSe, ZnS, ZnTe, CdS, CdSe, CdTe, etc.

As the film-forming raw material gases used for forming these functional deposited films in the present invention, there can be selectively used hydrides, halides, organometallic compounds, or the like compounds of the constituent elements of these semiconductor thin films to be formed, which can be introduced into the film-forming chamber, preferably in the gaseous state.

These starting compounds can be used alone or in combination of two or more of them. It is possible that these starting compounds are mixed with a rare gas such as He, Ne, Ar, Kr, Xe, Rn, etc. or a dilution gas such as $H_2$, HF, HCl, etc., and then introduced into the film-forming chamber.

In the present invention, the semiconductor thin film to be continuously formed may be controlled with respect to the valence electron or the forbitten band width by incorporating a valence electron controlling element or a forbidden band width controlling element into the film upon its formation. In this case, a raw material gas capable of imparting such element is introduced into the film-forming chamber independently or together with the film-forming raw material gas, optionally while being mixed with the above rare gas or dilution gas.

There can be mentioned a solar cell as one of the semiconductor devices which can be desirably produced by the present invention. Typical examples of the layer constitution of the solar cell are those shown in FIG. 20 through FIG. 22.

Shown in FIG. 20 is a photovoltaic element 1100 comprising a lower electrode 1102, an n-type semiconductor layer 1103, an i-type semiconductor layer 1104, a p-type semiconductor layer 1105, a transparent electrode 1106 and a collecting electrode 1107 being formed in this order on a substrate 1101. This photovoltaic element is of the type that light is impinged from the side of the transparent electrode 1106.

Shown in FIG. 21 is a tandem type photovoltaic element 1113 comprising two different pin junction photovoltaic cell units 1111 and 1112 being stacked, the i-type semiconductor layers of which being different from each other with respect to band gap and/or thickness. In the figure, numeral reference 1101 denotes a substrate, on which are stacked a lower electrode 1102, an n-type semiconduct or layer 1103, an i-type semiconductor layer 1104, a p-type semiconductor layer 1105, an n-type semiconductor layer 1108, an i-type semiconductor layer 1109, a p-type semiconductor layer 1110, a transparent electrode 1106 and a collecting electrode 1107 in this order. This photovoltaic element is of the type that light is impinged from the side of the transparent electrode 1106.

Shown in FIG. 22 is a triple type photovoltaic element 1124 comprising three different pin junction photovoltaic cell units 1120, 1121 and 1123 being stacked, the i-type semiconductor layers of which being different from each other with respect to band gap and/or thickness. In the figure, numeral reference 1101 denotes a substrate, on which are stacked a lower electrode 1102, an n-type semiconductor layer 1103, an i-type semiconductor layer 1104, a p-type semiconductor layer 1105, an n-type semiconductor layer 1114, an i-type semiconductor layer 1115, a p-type semiconductor layer 1116, an n-type semiconductor layer 1117, an i-type semiconductor layer 1118, a p-type semiconductor layer 1119, a transparent electrode 1106 and a collecting electrode 1107 in this order. This photovoltaic element is of the type that light is impinged from the side of the transparent electrode 1106.

In any of the above photovoltaic elements, the position of the n-type semiconductor layer may be replaced by the position of the p-type semiconductor layer.

In the following, explanation will be made of each of the constituents of these photovoltaic elements.

Substrate

As the substrate 1101 used in the present invention, there is desirably used a flexible member capable of forming a curved columnar shape, and said member is constituted by a paramagnetic material since it is magnetically supported by the magnetic body member.

For the photovoltaic element to be provided according to the present invention, an appropriate electrode is selectively used depending upon the configuration of the photovoltaic element. As such electrode, there can be mentioned lower electrode, upper electrode (transparent electrode) and collecting electrode. The upper electrode herein means the one to be placed on the side through which light is impinged, and the lower electrode means the one to be placed opposite to the upper electrode through the semiconductor layers arranged between the two electrodes.

Explanation will be made of these electrodes in the following.

Lower Electrode

In the case of each of the layer constitutions shown in FIG. 20 to FIG. 22, the lower electrode 1102 is disposed between the substrate 1101 and the n-type semiconductor layer 1103. However, when the substrate 1101 is conductive, the substrate may serve also as the lower electrode. In the case where the substrate 1101 is conductive but has a high sheet resistance, the electrode 1102 may be disposed as a low resistance electrode through which current is outputted or for the purpose of increasing the reflectance at the surface of the substrate and effectively utilizing incident light.

In the case where there is used an electrically insulating member as the substrate 1101, the lower electrode 1102 serving to output a photocurrent is placed between the substrate 1101 and the n-type semiconductor layer 1103.

The electrode materials include, for example, metals such as Ag, Au, Pt, Ni, Cr, Cu, Al, Ti, Zn, Mo, W and the like or alloys of these metals. The thin films of these metals or alloys may be properly formed by means of a vacuum deposition technique, electron-beam deposition technique or sputtering technique. However, due consideration shall be made for the metallic thin film to be formed so that it does not become a resistant component for the photovoltaic element. In this respect, the metallic thin film is desired to be such that has a sheet resistance of preferably, 50 Ω or less, more preferably 10 Ω or less.

It is possible to place a diffusion preventive layer (not shown in the figure) comprising a electroconductive material such as zinc oxide between the lower electrode 1102 and the n-type semiconductor layer 1103. In the case where such diffusion preventive layer is placed in this way, there are provided advantages such that it prevents the metal elements constituting the electrode 1102 from diffusing into the n-type semiconductor; as being provided with a certain resistance value, it prevents occurrence of short circuit, which would otherwise occur between the lower electrode 1102 and the transparent electrode 1106 through the semiconductor layers being arranged between them due to pinholes and the like; and it serves to generate multiple interferences with the thin film and confines the light as impinged within the photovoltaic element.

Upper electrode (transparent electrode)

The transparent electrode 1106 is desired to have a light transmittance of more than 85% so that it serves to make the semiconductor layers to efficiently absorb sunlight or fluorescent light. In addition to this, it is desired to have a sheet resistance of 100 or less from the viewpoint that it does not provide a resistance component to the power outputting of the photovoltaic element. In view of this, the transparent electrode 1106 is desired to comprise a thin film of a metal oxide such as $SnO_2$, $In_2O_3$, ZnO, CdO, $Cd_2SnO_4$, ITO ($In_2O_3+SnO_2$), etc. or a semitransparent thin film of a metal such as Au, Al, Cu, etc. The transparent electrode 1106 is disposed on the p-type semiconductor layer 1105, 1110 or 1119 in the case of FIG. 20, 21 or 22. These thin films may be formed by means of a resistance heating deposition technique, electron-beam heating deposition technique, sputtering technique or spraying technique.

Collecting Electrode

The collecting electrode 1107 is disposed on the transparent electrode 1106 for the purpose of reducing the surface resistance of the transparent electrode 1106. The electrode materials include, for example, thin films of metals such as Ag, Cr, Ni, Al, Ag, Au, Ti, Pt, Cu, Mo, W and the like or alloys of these metals. These thin films may be used by stacking them. The shape and the area of the collecting electrode are properly designed so that a sufficient quantity of light is impinged into the semiconductor layers.

Specifically as for the shape, it is desired to be such that extends uniformly all over the light receiving face of the photovoltaic element. As for the area, it is desired to correspond to a 15% or less in a preferred embodiment or a 10% or less in a more preferred embodiment respectively of said light receiving face.

And the member of constituting the collecting electrode is desired to be such that has a sheet resistance of preferably 50 Ω or less, more preferably, 10 Ω or less.

I-type Semiconductor Layer

The semiconductor materials to constitute the i-type semiconductor layer include, for example, so-called Group a semiconductor films, so-called Group a semiconductor alloy films such as a-Si:H, a-Si:F, a-Si:H:F, a-SiC:H, a-SiC:F, a-SiC:H:F, a-SiGe:H, a-SiGe:F, a-SiGe:H:F, poly-Si:H, poly-Si:F, poly-Si:H:F films, etc. Other than these semiconductor films, so-called compound semiconductor films of Group c or Group b are also usable.

N-type Semiconductor Layer and P-type Semiconductor Layer

The semiconductor materials to constitute the p-type or n-type semiconductor layer to be desirably used in the photovoltaic element to be prepared may be obtained by doping any of the foregoing semiconductor materials to constitute the i-type semiconductor layer with a valence electron controlling agent.

PRODUCTION EXAMPLES

The present invention will be explained in more detail with reference to production examples which will be under described. It should be noted that the present invention is not restricted by these production examples.

Production Example 1

There was formed an amorphous silicon film using the microwave plasma CVD apparatus shown in FIG. 15 as the apparatus of First Apparatus Embodiment of the present invention.

The present inventors conducted the formation of a deposited film while adjusting the setting angle of a pair of rectangular waveguides which are connected to the microwave applicators 107 and (108) as under described.

Explanation will be made of the setting angle of said pair of rectangular waveguides with reference to FIG. 3. FIG. 3 is a schematic explanatory view about the angle at which the two rectangular waveguides 111(C) and 112(C) are set. In FIG. 3, the rectangular waveguide 111(C) shown by a true line and the other rectangular waveguide 112(C) shown by a dotted line are connected respectively to the corresponding microwave applicator (not shown) provided to the side end face of the film-forming chamber 116(C), wherein the two microwave applicators are so arranged as to oppose each other through the film-forming space. For instance, the rectangular waveguide 111(C) is situated in the front and the rectangular waveguide 112(C) is situated in the back. The mark "0" stands for the center of the curved shape. The line A—A' stands for a face containing a central axis between the supporting and transporting rollers 102(C) and 103(C). The line H–H' stands for a face which is perpendicular to said A–A' face. The angle which is provided by a face B–B' in parallel to the face containing a major edge of the rectangular waveguide and the face H–H' is made to be $\Theta_1$. This angle is considered as the setting angle of the rectangular waveguide 111(C). The angle which is formed by a face C–C' in parallel to the face containing a major edge of the rectangular waveguide 112(C) and the face H–H' is made to be $\theta_2$. This angle is considered as the setting angle of the rectangular waveguide 112(C).

The present inventors made studies of the interrelations between the setting angle of the rectangular waveguides, discharge stability, and leakage of microwave. As a result, there were obtained results shown in Table 1.

In this production example, the formation of a deposited film was performed while setting the two rectangular waveguides at the angle shown in Table 1 where discharge was stabilized without leakage of microwave in the above.

Description will be made of the formation of a deposited film while referring to FIG. 15.

A bobbin 703 having a degreased and cleaned web member 101 (that is, substrate for film formation) made of SUS 430 LX (of 45 cm in width, 200 m in length and 0.25 mm in thickness) wound thereon was set in the vacuum chamber 701 provided with a substrate paying-out mechanism. The web member 101 was paid out, it was passed through the gas gate 721, the transportation mechanism in the isolated vessel 700 and the gas gate 722, and it was introduced into the vacuum chamber 702 provided with a substrate taking-up mechanism. Wherein, the web member was adjusted not to have any loose part. Then, the vacuum chambers 701 and 702 and the isolated vessel 700 were provisionally evacuated respectively by means of a rotary pump (not shown in the figure), and they were evacuated respectively by means of a mechanical booster pump (not shown in the figure) to a vacuum of about $10^{-3}$ Torr. The cylindrical alnico magnets 106 respectively provided with a heater and a cooling mechanism therein were operated to maintain the surface temperature of the web member 101 at 250° C. Then, the inner pressure of the isolated vessel was regulated to a vacuum of about $5\times10^{-6}$ Torr by means of an oil diffusion pump (HS-32, product by Varian Company)(not shown in the figure).

In the above, the conditions relative to the shape and size of the microwave applicators, the size of the curved shape and the like were made as shown in Table 2.

After gas in the inside of the isolated vessel was sufficiently exhausted, SiH$_4$, SiF$_4$ and H$_2$ were introduced through a gas feed pipe (not shown in the figure) into the film-forming chamber 723 at respective flow rates of 400 sccm, 5 sccm and 100 sccm. The inner pressure of the isolated vessel 700 was maintained at 5 mtorr. After the inner pressure became stable, a microwave power source (not shown in the figure) was switched on to radiate a microwave energy (2.45 GHz) through the two microwave applicators into the film-forming chamber 723 with an effective power of 1.0 kW×2, wherein the raw material gases introduced were decomposed to generate plasma thereby forming a plasma region. In this case, the plasma region was not leaked through the spacing between the supporting and transporting rollers 102 and 103 into the side of the isolated vessel. No leakage of microwave was detected.

The supporting and transporting rollers 102 and 103 and the supporting and transporting rings 104 and 105 (driving mechanisms of these are not shown in the figure) started rotating to transport the web member 101 at a transportation speed of 30 cm/min. Film formation was performed for 24 hours. During the film formation, the surface temperature of the web member 101 was regulated at 250° C. by means of the cooling mechanism of the cylindrical magnet 106.

In the above, H$_2$ gas as the gate gas was fed into gas gates 321 and 322 through gate gas supply pipes 716 and 717 at a flow rate of 50 sccm, wherein the gas gates were exhausted through exhaust pipes 718 and 719 by means of an oil diffusion pump (not shown in the figure) to bring their insides to and maintain at a vacuum of 1 mTorr. After the formation of an amorphous silicon deposited film, the web member 101 was taken up while being cooled. As for the web member 101 for which the film formation was performed, a prescribed 1 m length portion was cut off with respect to each of the web member portions respectively engaged in the film formation for a prescribed period of time since the time when discharge was started as shown in Table 3. As for each of the cut 1 m length web portions obtained, the film thickness was measured at 100 selected positions and a mean value among the measured film thicknesses was obtained. The results obtained were collectively shown in Table 3, wherein the case where the difference from the mean value was within 5% with respect to all the measured 100 positions was indicated by the mark "⊙", the case where the difference from the mean value was within 5% with respect to the measured 80 to 99 positions was indicated by the mark "O", the case where the difference from the mean value was within 5% with respect to the measured 50 to 79 positions was indicated by the mark "Δ", and the case where the difference from the mean value was within 5% with respect to the measured 30 to 49 positions was indicated by the mark "X".

In addition, as for each of the web member samples used for the measurement of the film thickness in the above, a 0.1 μm thick Cr film to be an electrode was formed on the amorphous silicon film by means of a vacuum evaporation technique, followed by measuring a dark conductivity. The measurement of dark conductivity was performed at each of the same 100 positions where the film thickness was measured in the above. The results obtained were collectively shown in Table 4, wherein on the basis of the lowest dark conductivity value among the dark conductivity values obtained at the 100 positions, the case where the dark conductivity values obtained at all the remaining positions were within 10 fold over the standard value was indicated by the mark "⊙", the case where the dark conductivity values obtained at the measured 80 to 99 positions were within 10 fold over the standard value was indicated by the mark "O", the case where the dark conductivity values obtained at the measured 50 to 79 positions were within 10 fold over the standard value was indicated by the mark "Δ", and the case where the dark conductivity values obtained at the measured 30 to 49 positions were within 10 fold over the standard value was indicated by the mark "X".

Comparative Production Example 1

The procedures of Production Example 1 were repeated, except that a partial modification of the apparatus of FIG. 15 used in Production Example 1 was used, to thereby perform the formation of an amorphous silicon deposited film. Particularly, the cylindrical alnico magnets 106 respectively provided with the heater and the cooling mechanism were removed from the apparatus of FIG. 15, and instead, a temperature controlling means provided with a lump heater and a cooling pipe capable of circulating a cooling medium (not shown in the figure) was arranged to be apart from the exterior face of the web member 101 in the isolated vessel 700.

As for the resultant deposited film, the measurement of film thickness and the evaluation of dark conductivity were conducted in the same manner as in Production Example 1. The results obtained were collectively shown in Tables 3 and 4.

Comparative Production Example 2

The procedures of Production Example 1 were repeated, except that a partial modification of the apparatus of FIG. 15 used in Production Example 1 was used, to thereby perform the formation of an amorphous silicon deposited film. Particularly, the cylindrical alnico magnets 106 respectively provided with the heater and the cooling mechanism were replaced by aluminum alloy series rollers respectively of the same structure as that of the cylindrical alnico magnet.

As for the resultant deposited film, the measurement of film thickness and the evaluation of dark conductivity were conducted in the same manner as in Production Example 1. The results obtained were collectively shown in Tables 3 and 4.

Comparative Production Example 3

The procedures of Comparative Production Example 2 were repeated, except that the constituent material of each of the rollers used in Comparative Production Example 2 was replaced by Al$_2$O$_3$, to thereby perform the formation of an amorphous silicon deposited film.

As for the resultant deposited film, the measurement of film thickness and the evaluation of dark conductivity were conducted in the same manner as in Production Example 1. The results obtained were collectively shown in Tables 3 and 4.

Comparative Production Example 4

The procedures of Comparative Production Example 2 were repeated, except that the constituent material of each of the rollers used in Comparative Production Example 2 was replaced by Si$_3$N$_4$, to thereby perform the formation of an amorphous silicon deposited film.

As for the resultant deposited film, the measurement of film thickness and the evaluation of dark conductivity were conducted in the same manner as in Production Example 1. The results obtained were collectively shown in Tables 3 and 4.

Comparative Production Example 5

The procedures of Comparative Production Example 2 were repeated, except that the constituent material of each of the rollers used in Comparative Production Example 2 was replaced by SiC, to thereby perform the formation of an amorphous silicon deposited film.

As for the resultant deposited film, the measurement of film thickness and the evaluation of dark conductivity were conducted in the same manner as in Production Example 1. The results obtained were collectively shown in Tables 3 and 4.

Comparative Production Example 6

The procedures of Comparative Production Example 2 were repeated, except that the constituent material of each of the rollers used in Comparative Production Example 2 was replaced by $ZrO_2$, to thereby perform the formation of an amorphous silicon deposited film.

As for the resultant deposited film, the measurement of film thickness and the evaluation of dark conductivity were conducted in the same manner as in Production Example 1. The results obtained were collectively shown in Tables 3 and 4.

Observation on the basis of the results obtained in Production Example 1 and Comparative Production Examples 1 to 6

From the results shown in Tables 3 and 4, the following findings were obtained.

That is, in the case of Production Example 1 wherein the apparatus comprising a magnetic body member having a function of pressing and transporting the web member and being provided with a mechanism of controlling the temperature of the web member, which is provided to the prior microwave plasma CVD apparatus such that it is in contact with the exterior face of the circumferential wall comprising the curved moving web member of the film-forming chamber, is used, even after the lapse of 20 hours or more since the commencement of discharge, there is stably formed a desirable deposited film of a uniform thickness and having a homogenous film property which is equivalent to the deposited film formed at the initial stage.

On the other hand, in the case of Comparative Production Example 1 wherein the prior microwave plasma CVD apparatus is used, at the stage after the lapse of about 16 hours since the commencement of discharge, the uniformity of not only thickness but also the property of the resulting film starts deteriorating and thereafter, the resulting film becomes considerably varied not only in thickness but also in properties. In the case of each of Comparative Production Examples 2 to 6 (except for Comparative Production Example 4) wherein the magnetic body member in the microwave plasma CVD apparatus used in Production Example 1 is replaced by one composed of a non-magnetic material, the tendency similar to that in Comparative Production Example 1 is provided. In the case of Comparative Production Example 4 wherein the magnetic body member in the microwave plasma CVD apparatus used in Production Example 1 is replaced by one composed of $Si_3N_4$, the resulting film after the lapse of 20 hours from the commencement of discharge seems acceptable in view of film thickness but varies in film properties. Thereafter, the resulting film becomes considerably varies not only in thickness but also in properties.

From what is described above, it is understood that according to Production Example 1 (the present invention), even after performing the film formation while continuously maintaining discharge over a period of time as long as 20 hours, a desirable deposited film excelling in uniformity of thickness and homogeneity of properties is still stably formed. It is believed the reason for this is the magnetic body members provided so as to be in contact with the exterior face of the circumferential wall comprising the curved moving web member of the film-forming chamber, heat is effectively transmitted and the web member is insured to be always in close contact with the opposite supporting and transporting rings situated at the two side faces of the film-forming chamber. Because of this, even in the case where the film formation is continuously performed over a long period of time, the foregoing problems relative to deformation of the web member and the like which are occurred in the case of the prior microwave plasma CVD apparatus are prevented from occurring.

Production Example 2

The procedures of Production Example 1 were repeated, except that each of the cylindrical alnico magnets 106 was replaced by a cylindrical Fe—Cr—Co magnet, to thereby perform the film formation of a deposited film. The resultant deposited film was evaluated in the same manner as in Production Example 1. As a result, the evaluated results were distinguishably excellent as well as those obtained in Production Example 1.

Production Example 3

The procedures of Production Example 1 were repeated, except that each of the cylindrical alnico magnets 106 was replaced by a cylindrical ferrite magnet, to thereby perform the film formation of a deposited film. The resultant deposited film was evaluated in the same manner as in Production Example 1. As a result, the evaluated results were distinguishably excellent as well as those obtained in Production Example 1.

Production Example 4

The procedures of Production Example 1 were repeated, except that each of the cylindrical alnico magnets 106 was replaced by a cylindrical rare element magnet, to thereby perform the film formation of a deposited film. The resultant deposited film was evaluated in the same manner as in Production Example 1. As a result, the evaluated results were distinguishably excellent as well as those obtained in Production Example 1.

Production Example 5

The procedures of Production Example 1 were repeated, except that the effective power of microwave applied was changed to 0.85 kW×2 and the transportation speed of the web member 101 was changed to 1.5 m/min., to thereby perform the film formation of an amorphous silicon film for 30 minutes. As for the web member 101 for which the film formation was performed, a portion of 1 m length from the end thereof was cut off. As for the cut 1 m length web portions obtained, the film thickness was measured at 100 selected positions. As a result, it was found that the difference from the mean value is within 5% with respect to all the measured positions not only in the width direction but also in the lengthwise direction and that the deposition rate is 125 Å on the average. In addition, a part of the above cut web member sample having the deposited film thereon was cut off, followed by subjecting to measurement of an infrared absorption spectrum by a reflection method using a FT-IR (1720X, product by Perkin-Elmer Company). As a result, there were observed a distinct absorption at 2000 cm$^{-1}$ and 630 cm$^{-1}$, which is the inherent absorption pattern of a-Si:H:F film. Further, the crystallinity of the sample was examined by a RHEED (JEM- 100SX, product by JEOL, Ltd.). As a result, there was observed a halo pattern, and because of this, the deposited film was found to be amorphous. Further in addition, the sample was subjected to measurement of hydrogen content using a hydrogen content analyser (EMGA-1100, product by Horiba, Ltd.). As a result, the hydrogen content of the deposited film was found to be 20±2 atomic %.

Production Example 6

There was formed an amorphous silicon film using the microwave plasma CVD apparatus shown in FIG. 16 as the apparatus of Second Apparatus Embodiment of the present invention.

As the microwave applicator, there was used a microwave applicator of the configuration shown in FIG. 9 which is of 480×80 (mm)(L×W) in aperture size and 530×55, 75 (mm) (L×W$_1$, W$_2$) in shutter size.

As well as in the case of Production Example 1, a bobbin 703 having a web member made of SUS 430 LX (of 60 cm in width, 100 m in length and 0.25 mm in thickness) wound thereon was set to the apparatus, wherein the web member was passed through until the vacuum chamber 702 provided with a substrate taking-up mechanism, and the web member was adjusted not to have any loose part.

Then, the isolated vessel 400 was provisionally evacuated, and it was evacuated by means of a mechanical booster pump to a vacuum of about 10$^{-3}$ Torr. The cylindrical Fe—Cr—Co magnets 106 respectively provided with a heater and a cooling mechanism therein were operated to maintain the surface temperature of the web member 101 at 250° C. Then, the inner pressure of the isolated vessel was regulated to a vacuum of about 5×10$^{-6}$ Torr by means of an oil diffusion pump (HS-32, product by Varian Company)(not shown in the figure).

After gas in the inside of the isolated vessel was sufficiently exhausted, SiH$_4$, SiF$_4$ and H$_2$ were introduced through the gas feed pipe 112 into the film-forming chamber at respective flow rates of 600 sccm, 10 sccm and 50 sccm. The inner pressure of the film-forming chamber 723 was maintained at 9 mTorr by regulating the opening of the throttle valve provided at the oil diffusion pump. After the inner pressure became stable, a microwave power source (not shown in the figure) was switched on to radiate a microwave energy through the microwave applicator 301 into the film-forming chamber with an effective power of 0.8 kW, wherein the raw material gases introduced were decomposed to generate plasma thereby forming a plasma region. In this case, the plasma region was not leaked through the metal mesh members 501 and 501' (respectively, of 1 mm in line width and 5 mm in space size) disposed at the side face of each of the supporting and transporting rings 104 and 105 into the side of the isolated vessel. And no leakage of microwave was detected.

The supporting and transporting rollers 102 and 103 and the supporting and transporting rings 104 and 105 (driving mechanisms of these are not shown in the figure) started rotating to transport the web member 101 at a transportation speed of 30 cm/min. Film formation was performed for 30 minutes.

In the above, H$_2$ gas as the gate gas was fed into gas gates 721 and 722 through gate gas supply pipes 716 and 717 at a flow rate of 50 sccm, wherein the gas gates were exhausted through exhaust pipes 718 and 719 by means of an oil diffusion pump (not shown in the figure) to bring their insides to and maintain at a vacuum of 1 mTorr.

As for the web member 101 for which the film formation was performed, a portion of 1 m length from the end thereof was cut off. As for the cut 1 m length web portions obtained, the film thickness was measured at 100 selected positions. As a result, it was found that the difference from the mean value is within 5% with respect to all the measured positions not only in the width direction but also in the lengthwise direction and that the deposition rate is 125 Å on the average. In addition, a part of the above cut web member sample having the deposited film thereon was cut off, followed by subjecting to measurement of an infrared absorption spectrum by a reflection method using a FT-IR (1720X, product by Perkin-Elmer Company). As a result, there were observed a distinct absorption at 2000 cm$^{-1}$ and 630 cm$^{-1}$, which is the inherent absorption pattern of a-:Si:H:F film. Further, the crystallinity of the sample was examined by a RHEED (JEM-100SX, product by JEOL, Ltd.). As a result, there was observed a halo pattern, and because of this, the deposited film was found to be amorphous. Further in addition, the sample was subjected to measurement of hydrogen content using a hydrogen content analyser (EMGA-1100, product by Horiba, Ltd.). As a result, the hydrogen content of the deposited film was found to be 20±2 atomic %.

TABLE 1

| $\theta_1$ (°) | $\theta_2$ (°) | $\theta_1 + \theta_2$ (°) | evaluated results |
|---|---|---|---|
| 0 | 0 | 0 | large microwave leakage, unstable discharge, remarkable noise of the microwave power source (abnormal oscillation) |
| 0 | 45 | 45 | large microwave leakage, unstable discharge |
| 0 | 90 | 90 | same as above |
| 15 | 15 | 30 | medium degree microwave leakage, unstable leakage |
| 15 | 45 | 60 | slight microwave leakage, unstable discharge |
| 15 | 75 | 90 | same as above |
| 15 | 135 | 150 | same as above |
| 15 | 165 | 180 | medium degree microwave leakage, unstable discharge, remarkable noise of the microwave power source (abnormal oscillation) |
| 30 | 30 | 60 | no microwave leakage, stable discharge |
| 30 | 60 | 90 | same as above |
| 30 | 105 | 135 | same as above |
| 30 | 150 | 180 | no microwave leakage, unstable discharge, remarkable noise of the microwave power source (abnoramal oscillation) |
| 45 | 45 | 90 | no microwave leakage, stable discharge |
| 45 | 90 | 135 | no microwave leakage, stable discharge |
| 45 | 105 | 150 | same as above |
| 45 | 135 | 180 | no microwave leakage, unstable discharge, remarkable noise of the microwave power source (abnormal oscillation) |
| 60 | 60 | 120 | no microwave leakage, |
|  |  | 120 | stable discharge |
| 60 | 75 | 135 | same as above |
| 60 | 90 | 150 | same as above |

TABLE 1-continued

| θ₁ (°) | θ₂ (°) | θ₁ + θ₂ (°) | evaluated results |
|---|---|---|---|
| 60 | 120 | 180 | no microwave leakage, unstable discharge, remarkable noise of the microwave power source (abnormal oscillation) |
| 75 | 75 | 150 | no microwave leakage, stable discharge |
| 75 | 90 | 165 | no microwave leakage, slightly unstable discharge |
| 75 | 105 | 180 | no microwave leakage, unstable discharge, remarkable noise of the microwave power source (abnormal oscillation) |
| 90 | 90 | 180 | no microwave leakage, unstable discharge, remarkable noise of the microwave power source (abnormal oscillation) |

TABLE 2

| | |
|---|---|
| inside diameter of the curved shape (cm) | φ 20 |
| size of the microwave applicator (diameter × length) | φ 98 mm × 135 mm |
| microwave transmitting waveguide | EIAJ, WRI-32 |

TABLE 3

| | lapse of time since the commencement of discharge | | | | |
|---|---|---|---|---|---|
| | 8 | 12 | 16 | 20 | 24 |
| Production Example 1 | ⊚ | ⊚ | ⊚ | ⊚ | ⊚ |
| Comparative Production Example 1 | ⊚ | ⊚ | ○ | Δ | X |
| Comparative Production Example 2 | ⊚ | ⊚ | ○ | Δ | Δ |
| Comparative Production Example 3 | ⊚ | ⊚ | ○ | Δ | Δ |
| Comparative Production Example 4 | ⊚ | ⊚ | ○ | ○ | Δ |
| Comparative Production Example 5 | ⊚ | ⊚ | ○ | Δ | X |
| Comparative Production Example 6 | ⊚ | ⊚ | ○ | Δ | Δ |

TABLE 4

| | lapse of time since the commencement of discharge | | | | |
|---|---|---|---|---|---|
| | 8 | 12 | 16 | 20 | 24 |
| Production Example 1 | ⊚ | ⊚ | ⊚ | ⊚ | ⊚ |
| Comparative Production Example 1 | ⊚ | ⊚ | ○ | X | X |
| Comparative Production Example 2 | ⊚ | ⊚ | ○ | Δ | X |
| Comparative Production Example 3 | ⊚ | ⊚ | ○ | Δ | X |
| Comparative Production Example 4 | ⊚ | ⊚ | ○ | Δ | Δ |
| Comparative Production Example 5 | ⊚ | ⊚ | ○ | Δ | X |
| Comparative Production Example 6 | ⊚ | ⊚ | ○ | Δ | Δ |

Figure 1A:
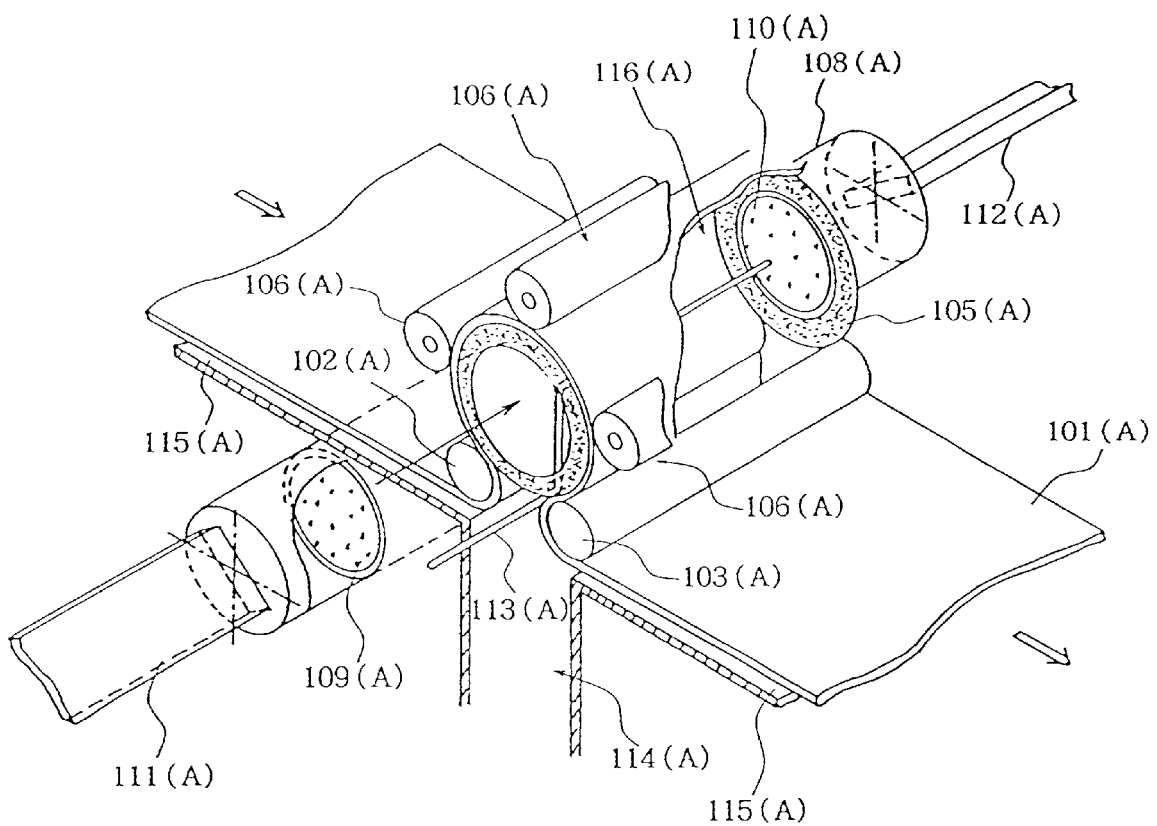
FIG. 1(A) is a schematic diagram illustrating the constitution of an embodiment of the microwave plasma CVD apparatus according to the present invention.
Figure 1B:
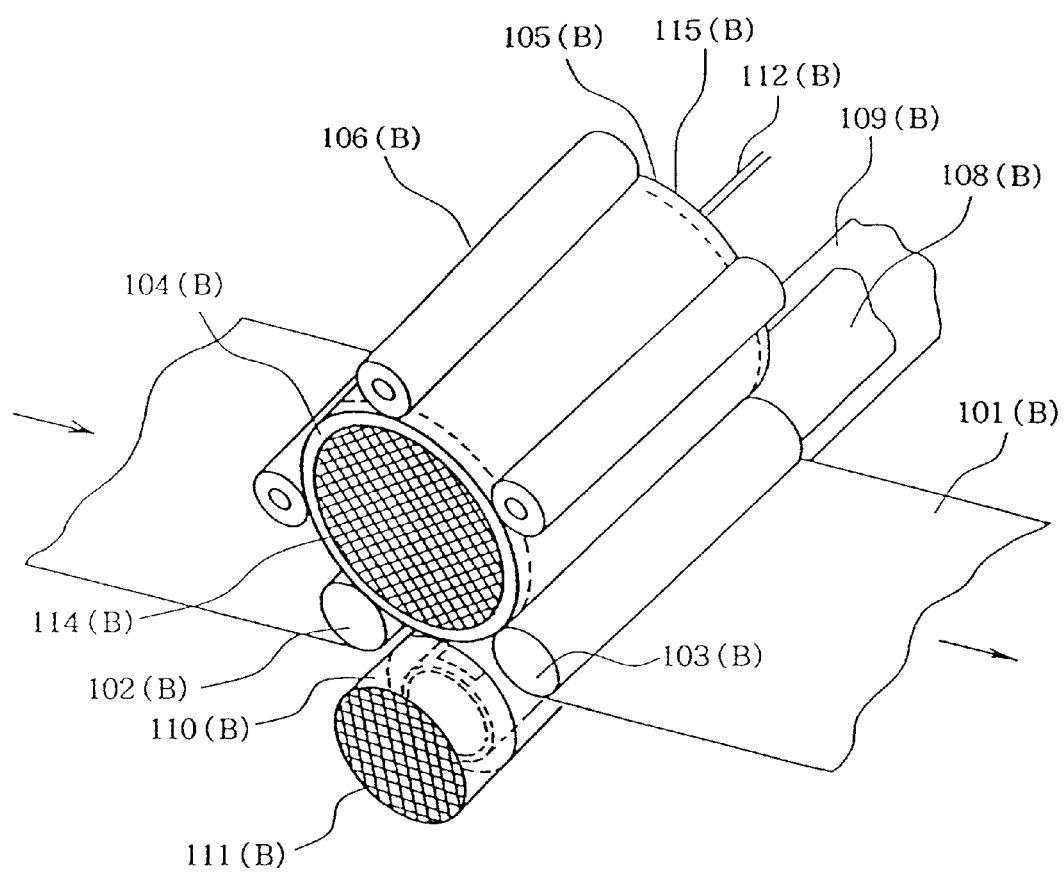
FIG. 1(B) is a schematic diagram illustrating the constitution of other embodiment of the microwave plasma CVD apparatus according to the present invention.
Figure 2:
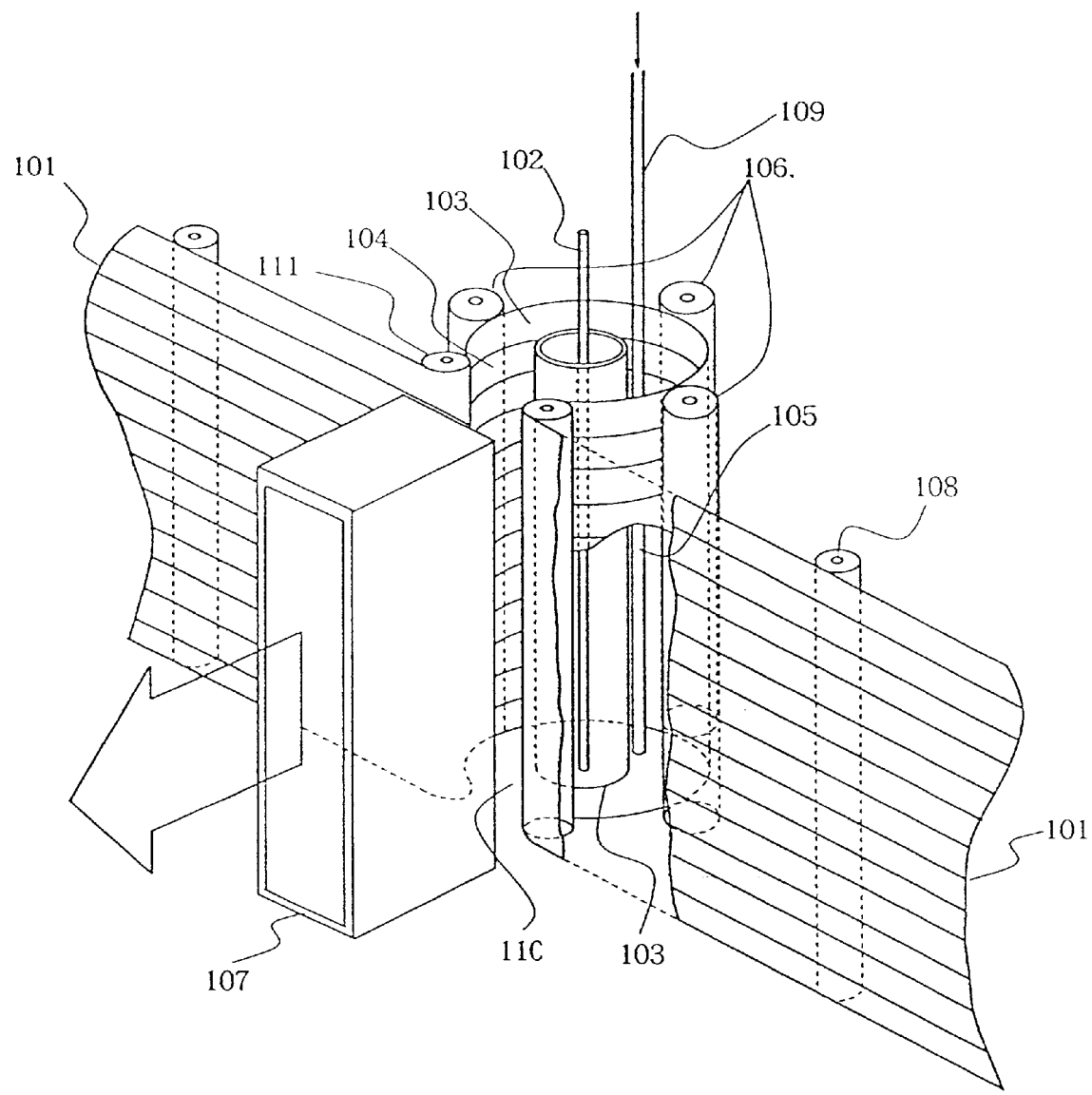
FIG. 2 is a schematic diagram illustrating the constitution of a further embodiment of the microwave plasma CVD apparatus according to the present invention.
Figure 3:
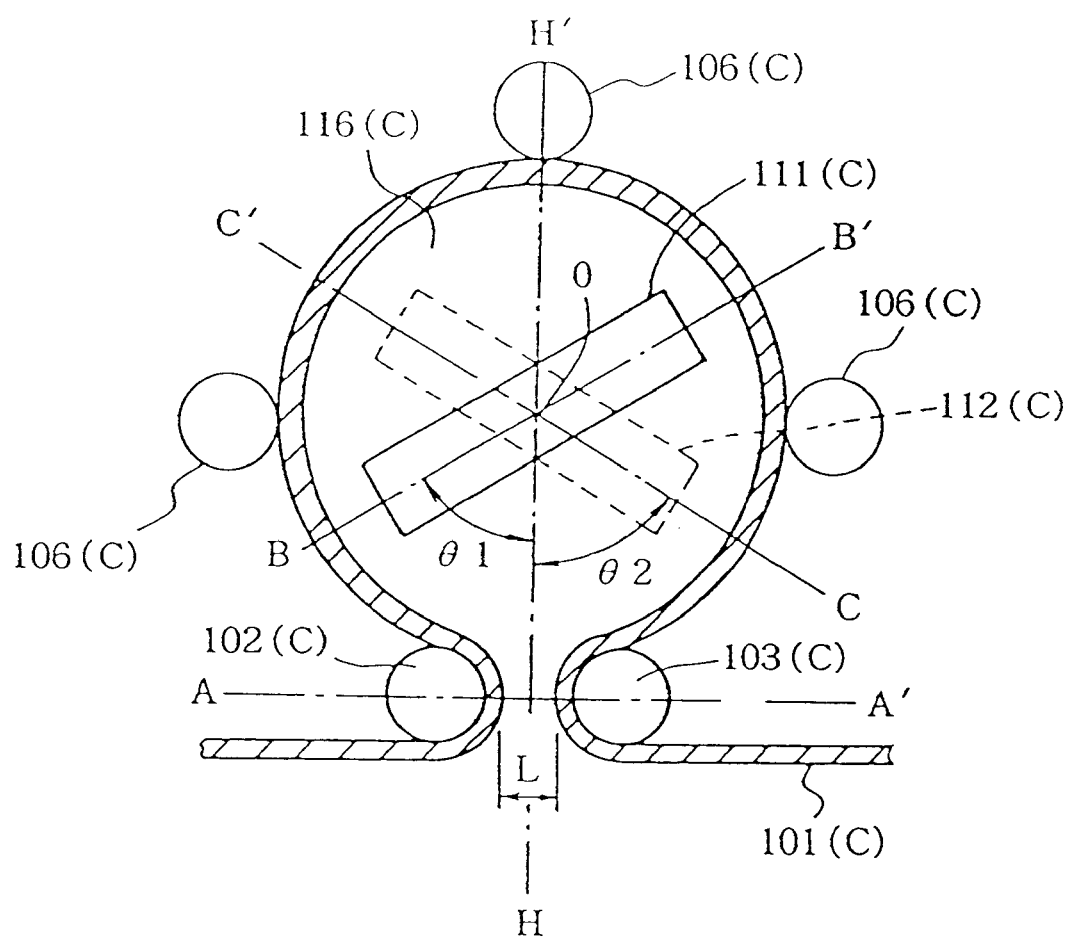
FIG. 3 is a view schematically illustrating the cross-sectional form of an embodiment of the microwave plasma CVD apparatus according to the present invention.
Figure 4:
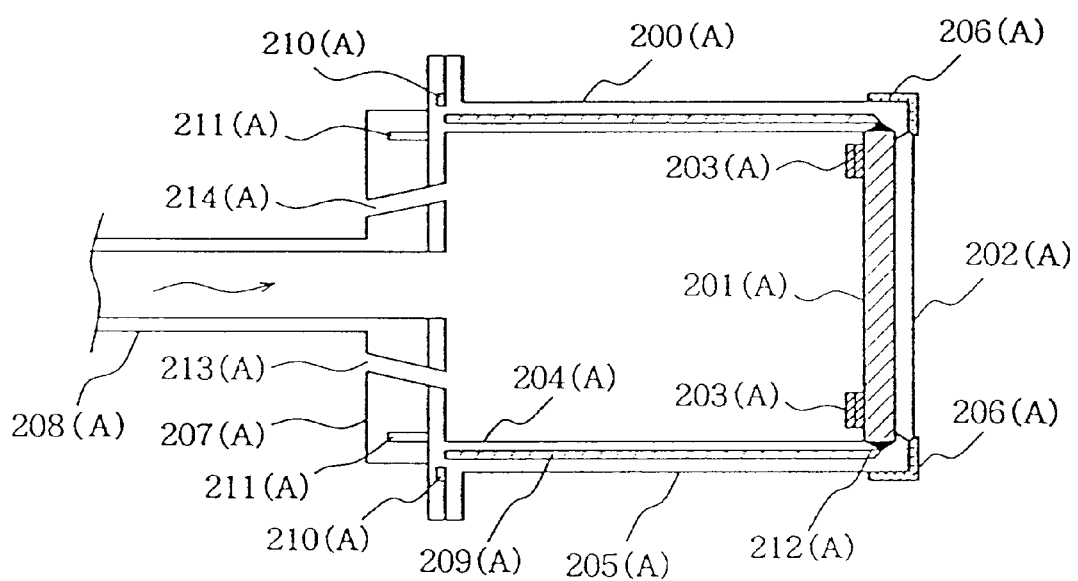
FIG. 4 is a view schematically illustrating the constitution of an embodiment of the microwave applicator means in the present invention.
Figure 5:
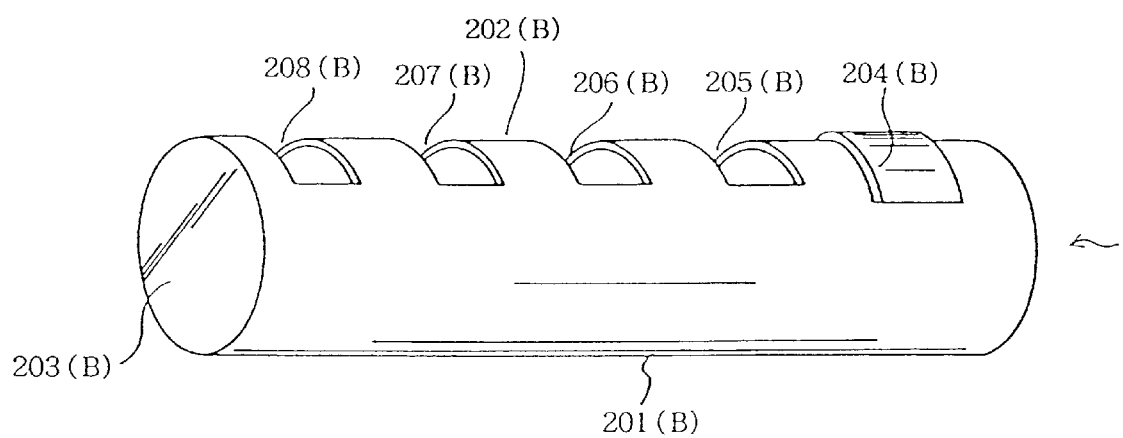
FIG. 5 is a view schematically illustrating the constitution of other embodiment of the microwave applicator means in the present invention.
Figure 6:
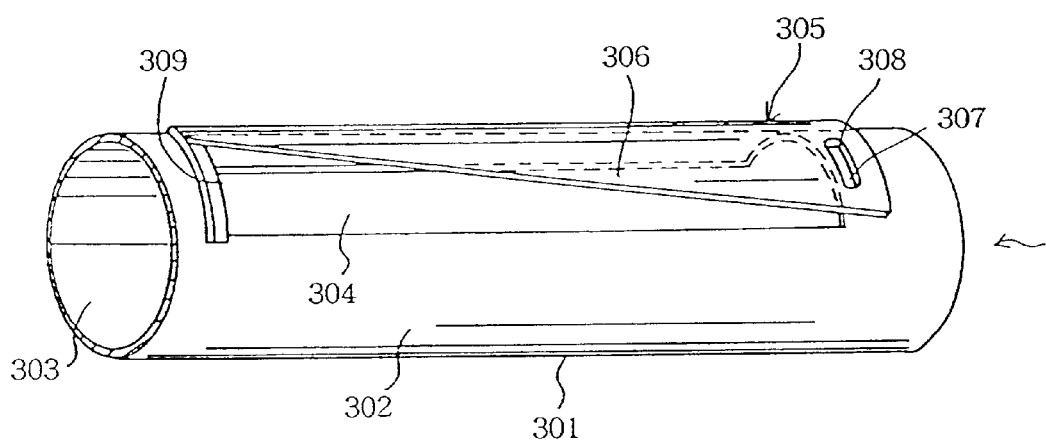
FIG. 6 is a view schematically illustrating the constitution of a further embodiment of the microwave applicator means in the present invention.
Figure 7:
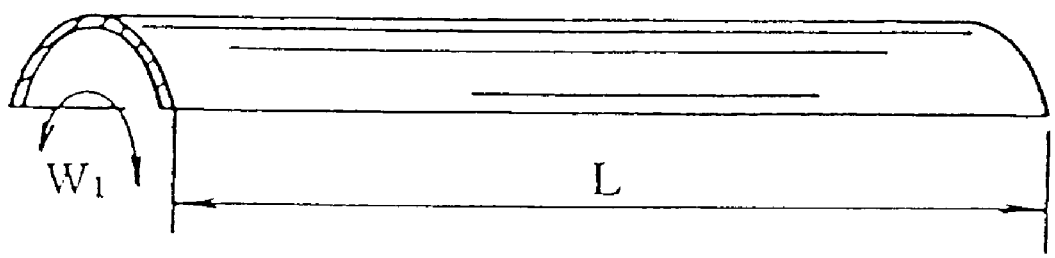
FIG. 7 is a view schematically illustrating the constitution of a further embodiment of the microwave applicator means in the present invention.
Figure 8:
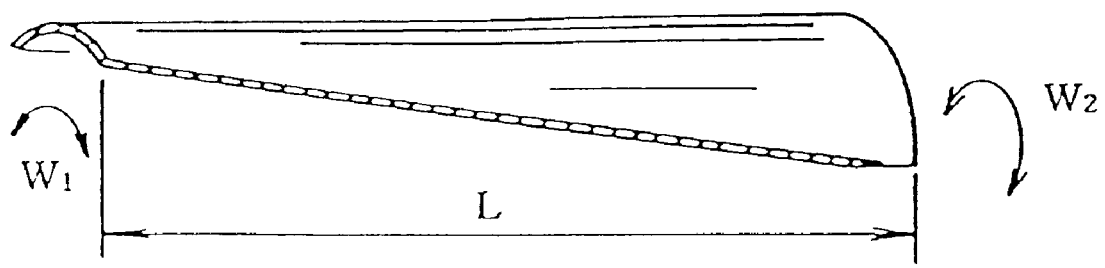
FIG. 8 is a view schematically illustrating the constitution of a further embodiment of the microwave applicator means in the present invention.
Figure 9:
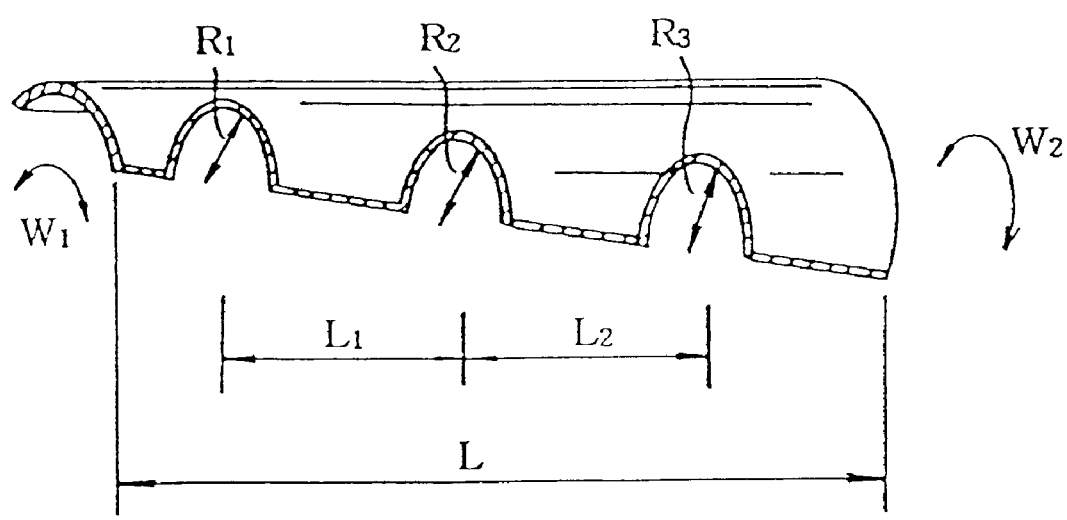
FIG. 9 is a view schematically illustrating the constitution of a further embodiment of the microwave applicator means in the present invention.
Figure 10:
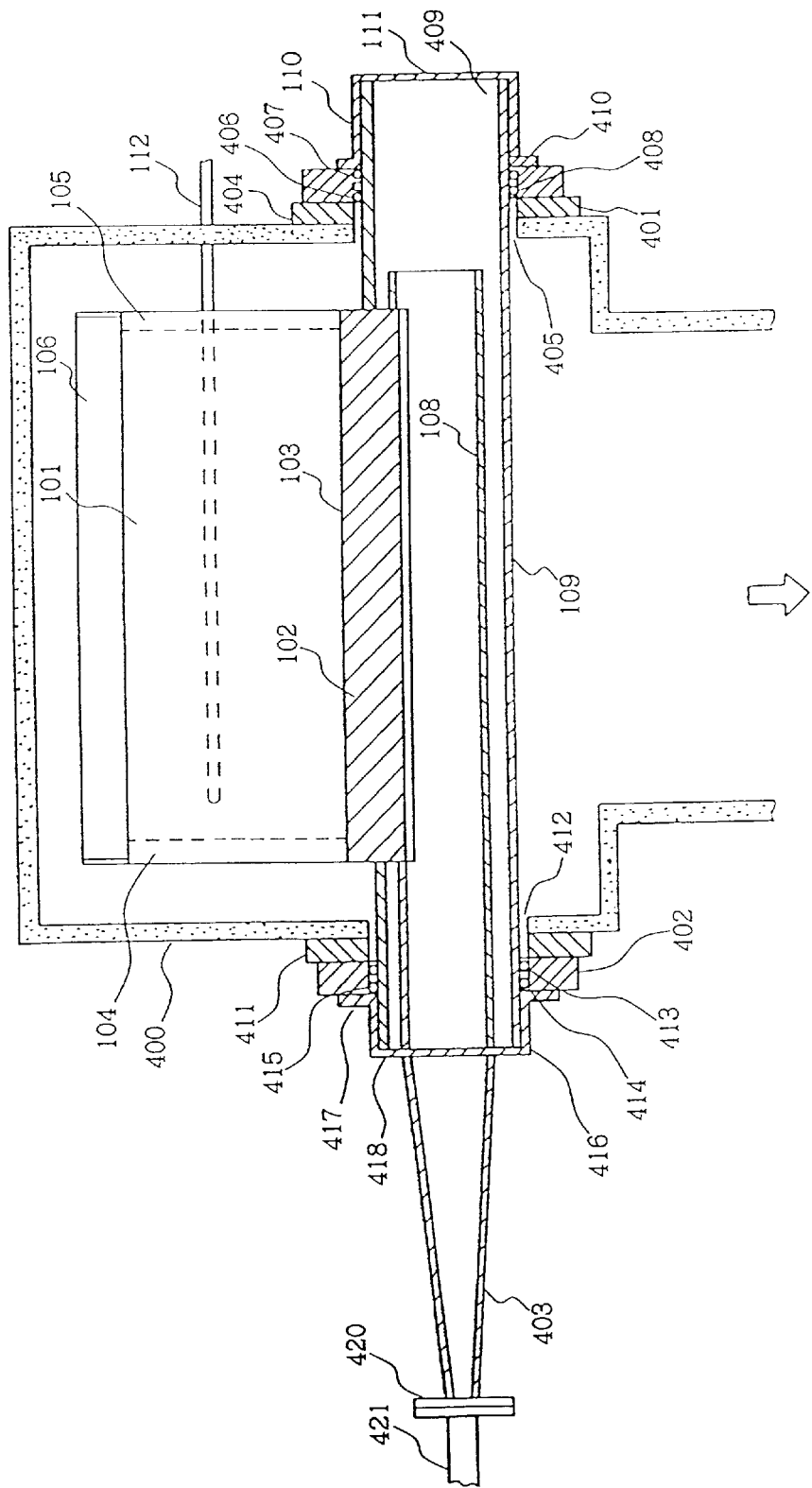
FIG. 10 is a view schematically illustrating the cross-sectional form of other embodiment of the microwave plasma CVD apparatus according to the present invention.
Figure 11:
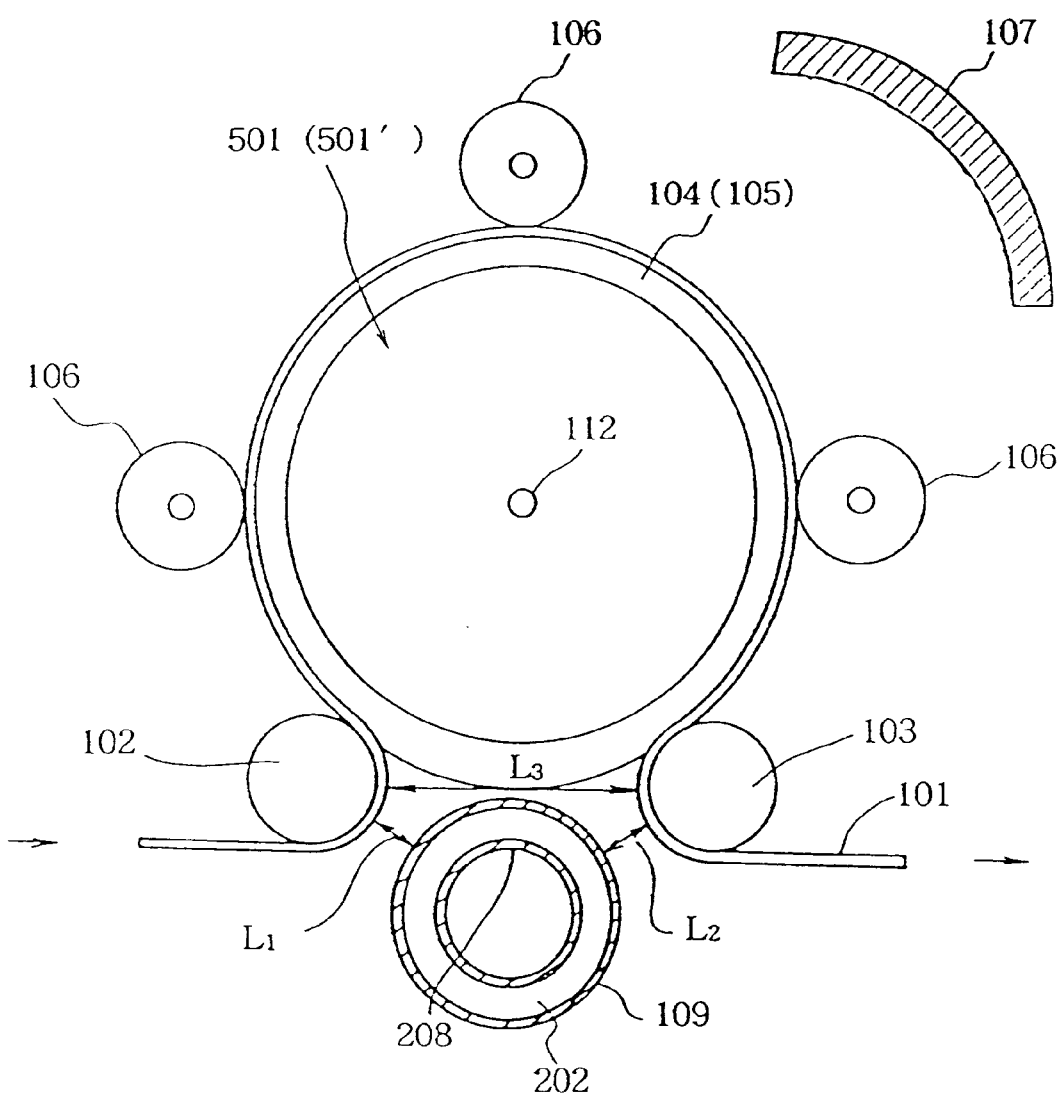
FIG. 11 is a view schematically illustrating the cross-sectional form of a further embodiment of the microwave plasma CVD apparatus according to the present invention.
Figure 12:
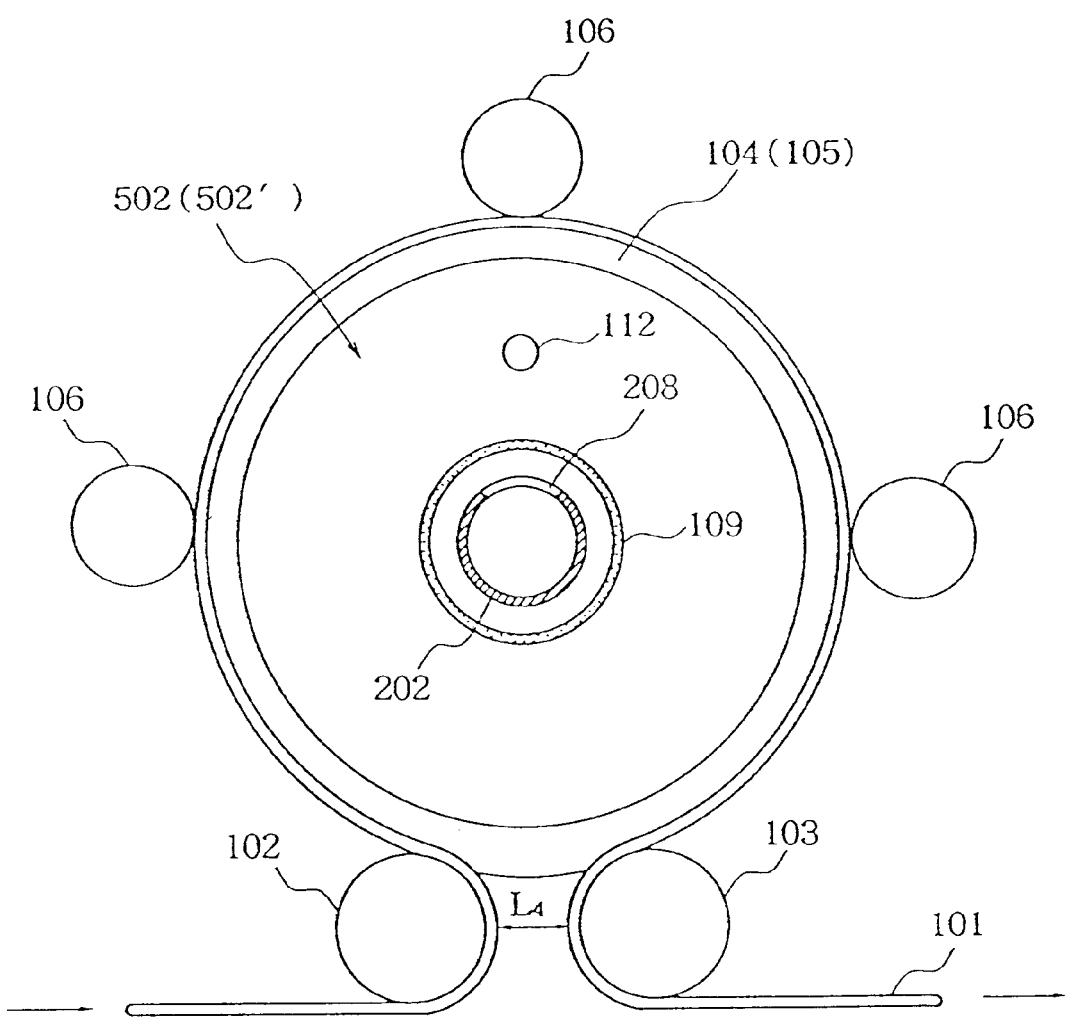
FIG. 12 is a view schematically illustrating the cross-sectional form of a further embodiment of the microwave plasma CVD apparatus according to the present invention.
Figure 13:
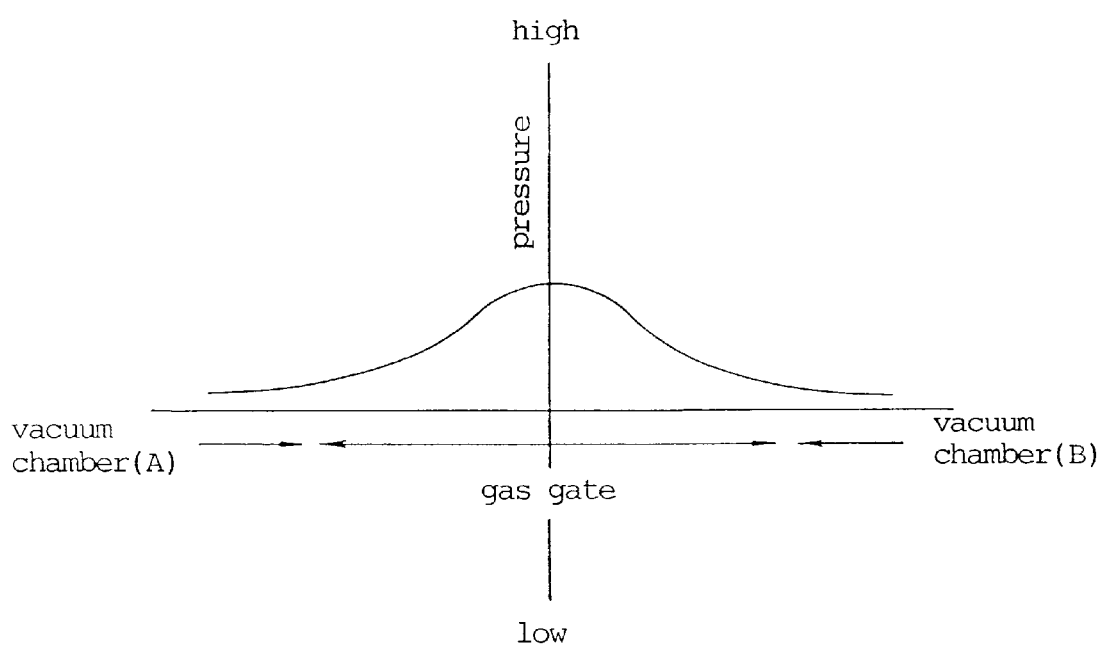
FIG. 13 is a schematic view illustrating a pressure gradient curve of the gas gate means in the present invention.
Figure 14:
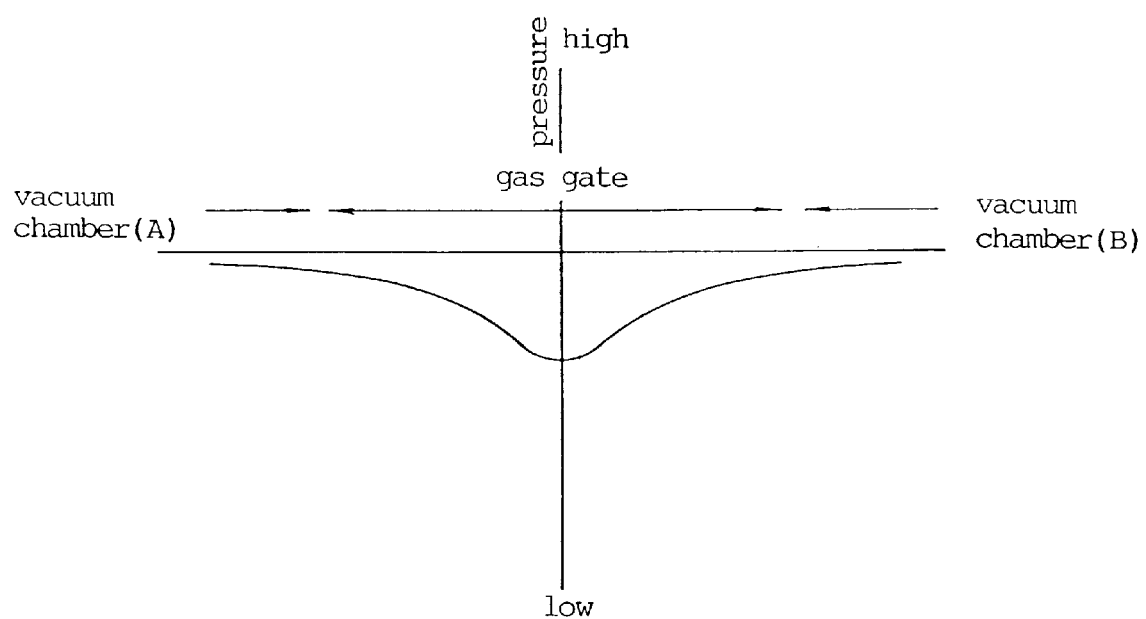
FIG. 14 is a schematic view illustrating other pressure gradient curve of the gas gate means in the present invention.
Figure 15:
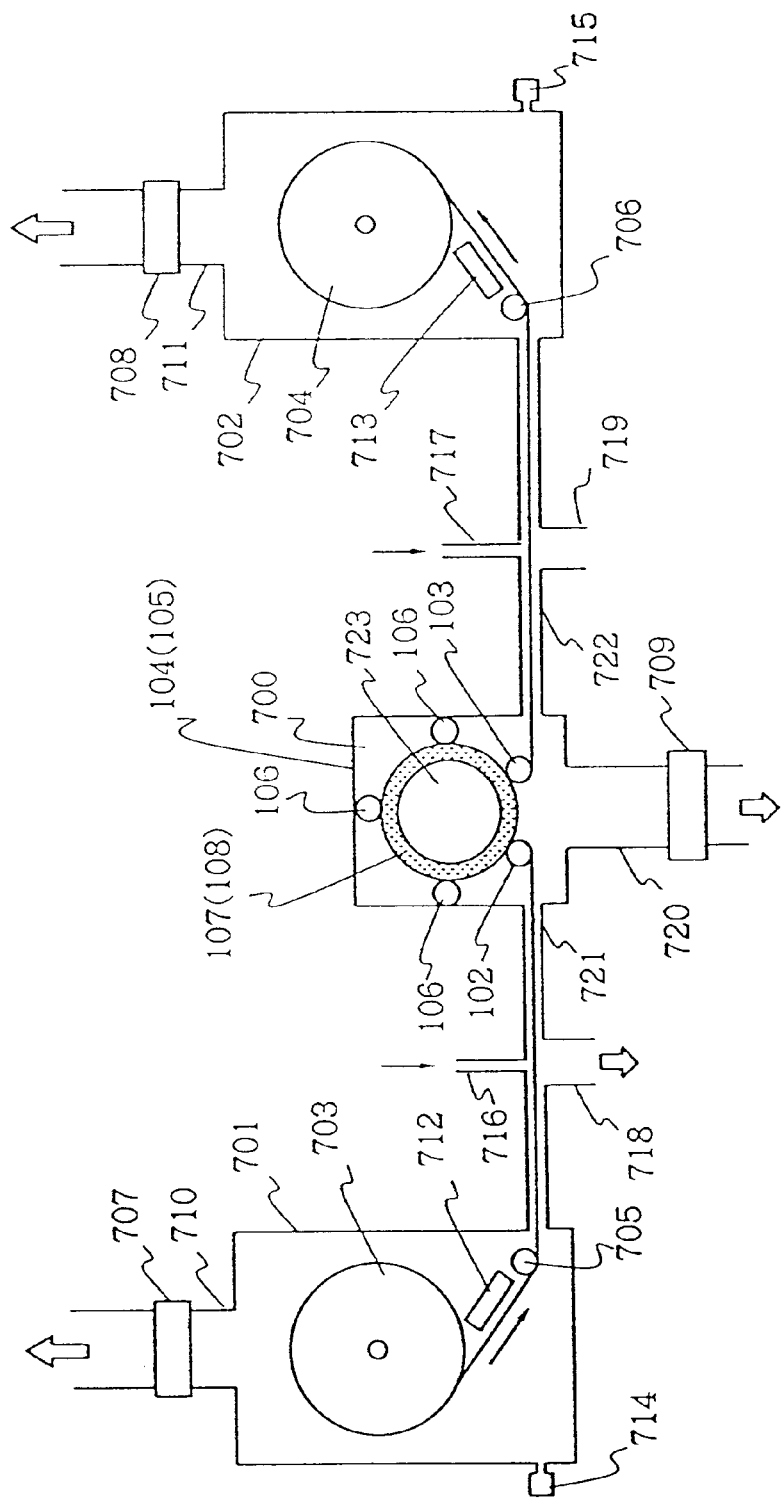
FIG. 15 is a schematic diagram illustrating the constitution of a further embodiment of the microwave plasma CVD apparatus according to the present invention.
Figure 16:
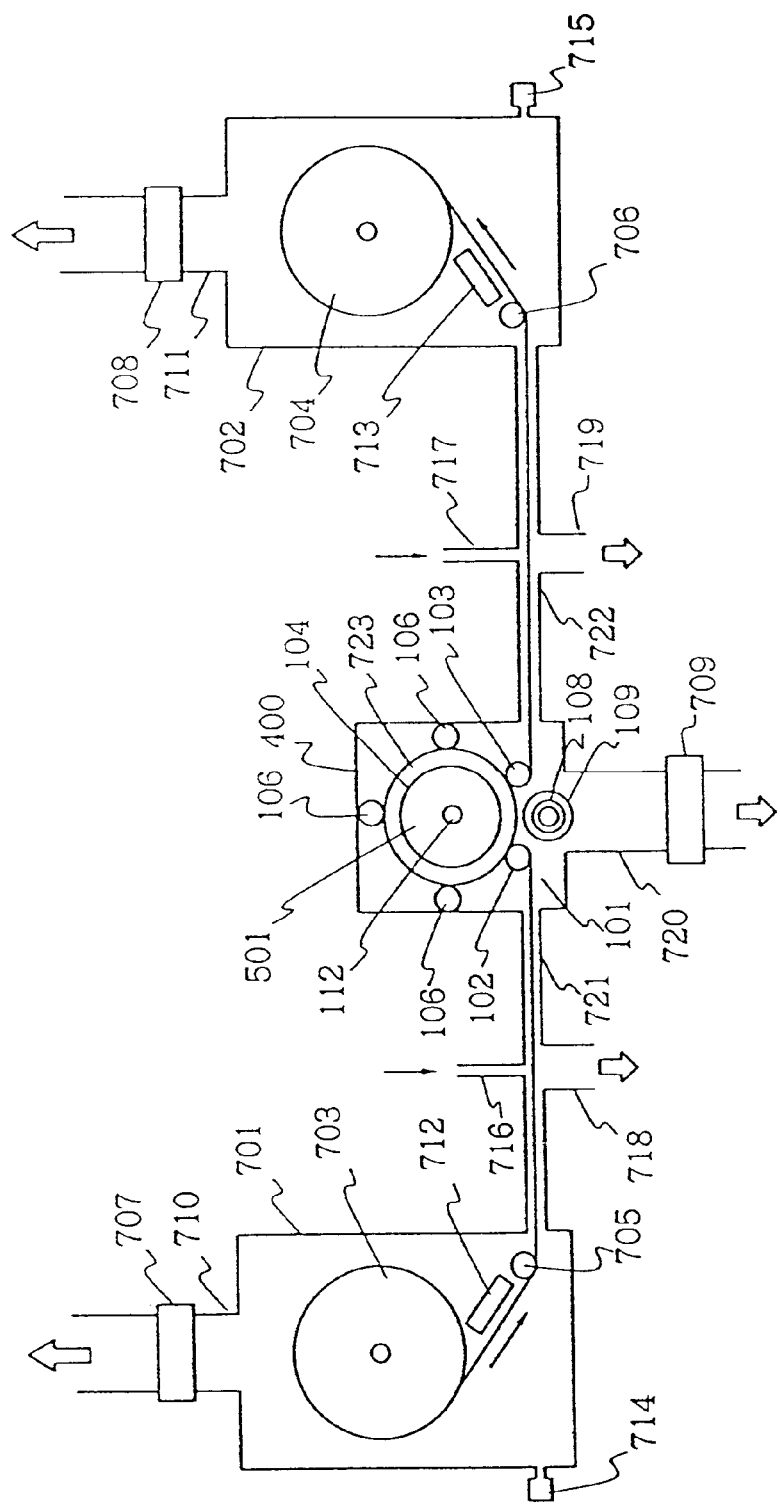
FIG. 16 is a schematic diagram illustrating the constitution of a further embodiment of the microwave plasma CVD apparatus according to the present invention.
Figure 17A:
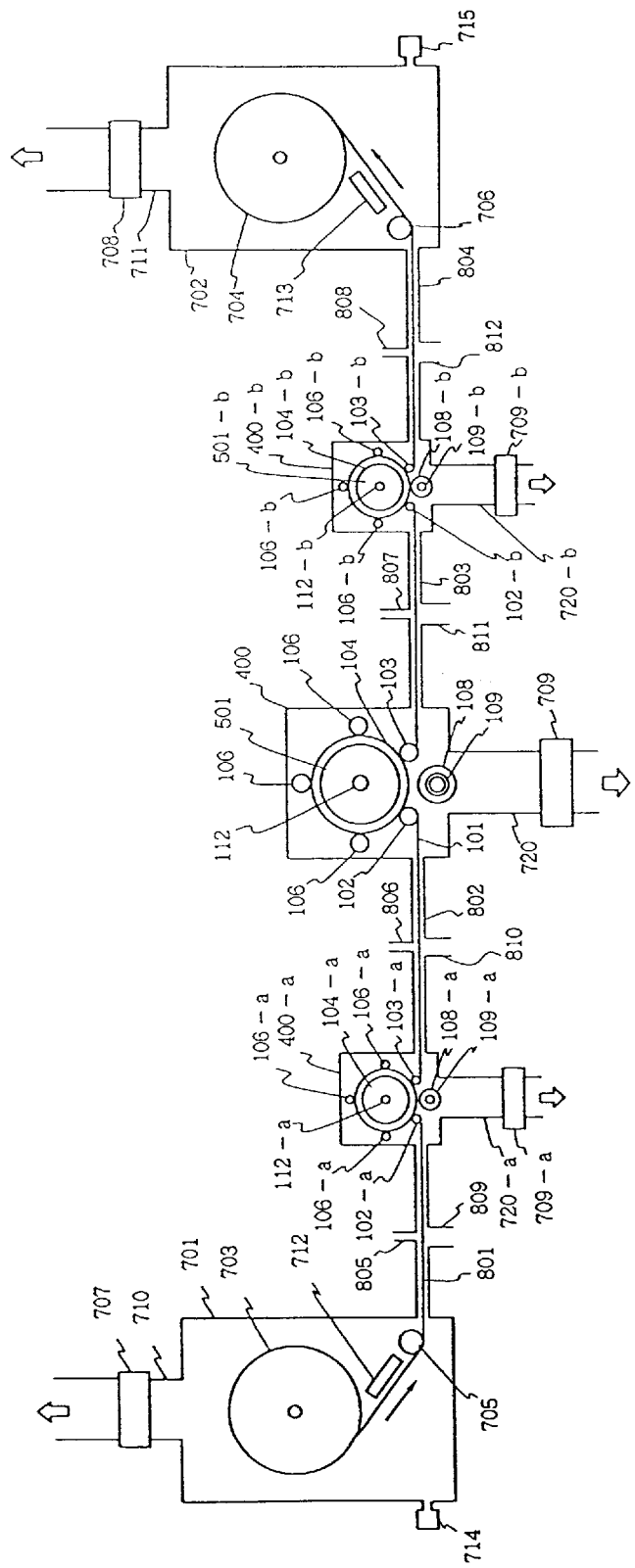
FIG. 17 is a schematic diagram illustrating the constitution of a further embodiment of the microwave plasma CVD apparatus according to the present invention.
Figure 17B:
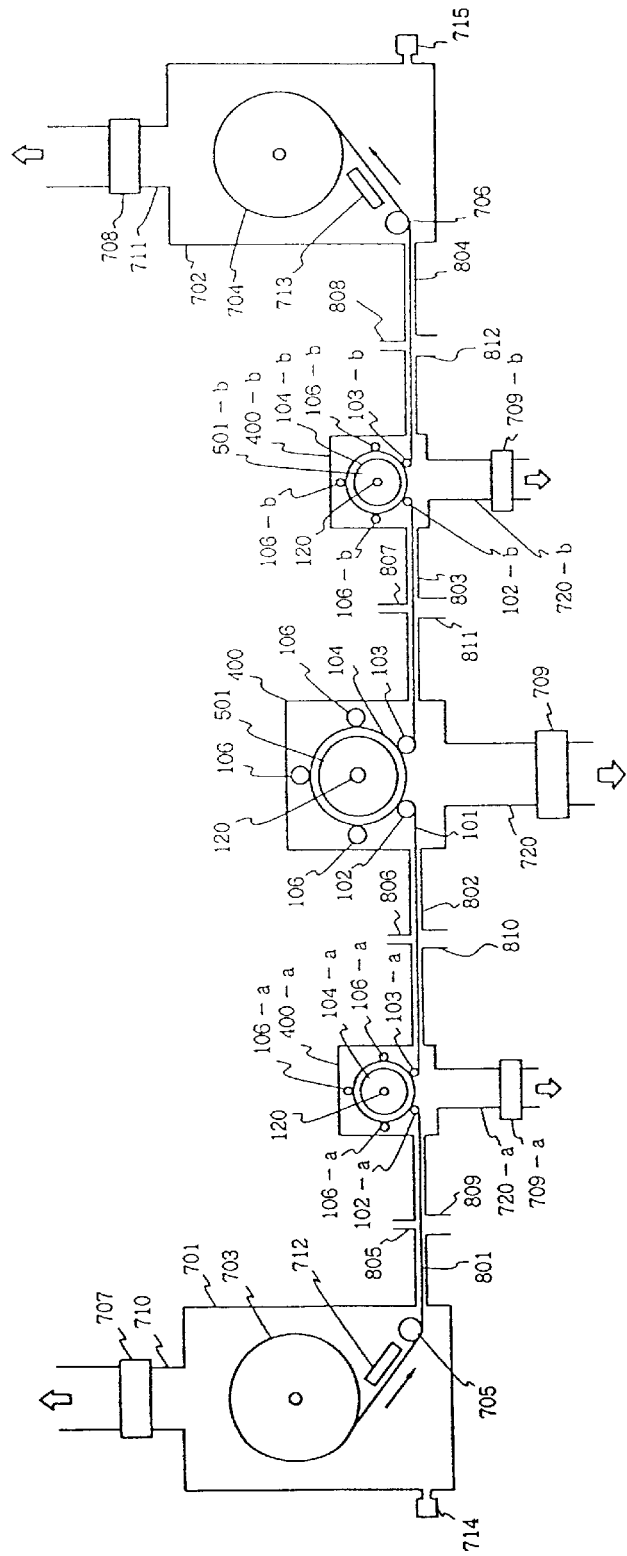
Figure 18:
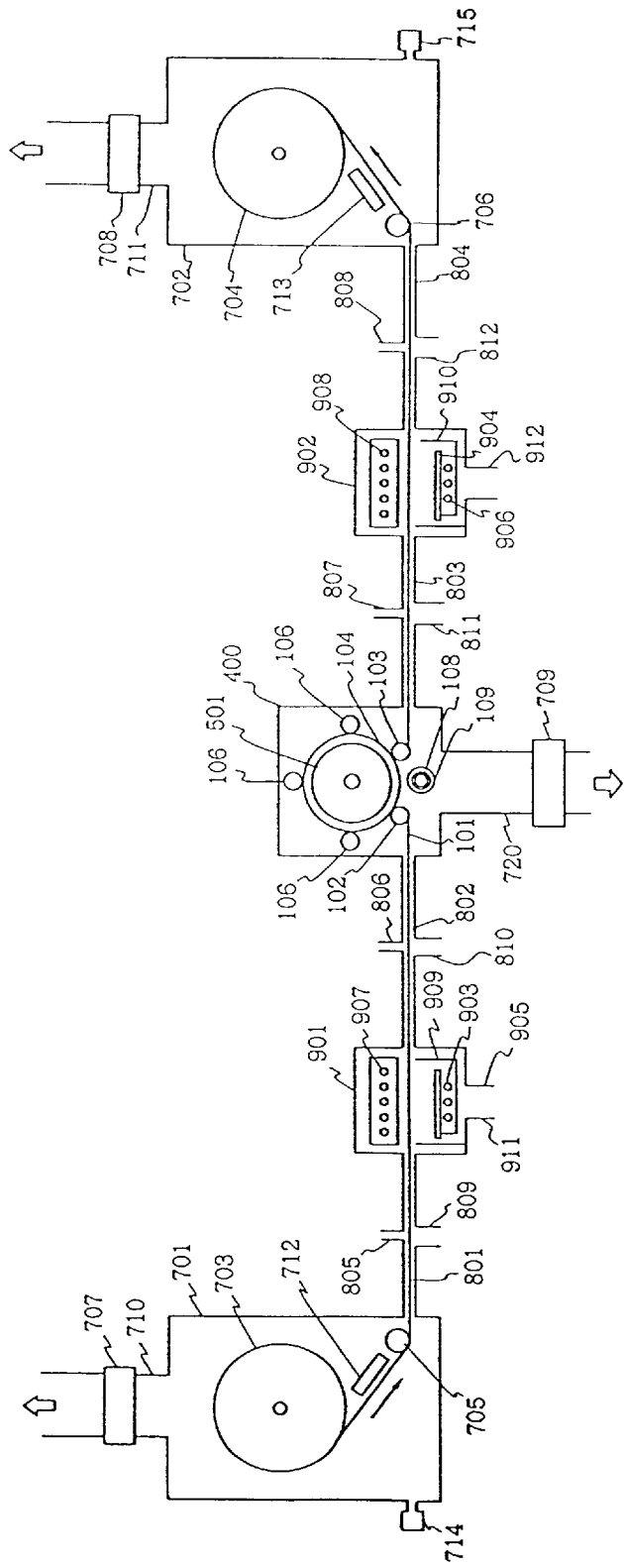
FIG. 18 is a schematic diagram illustrating the constitution of a further embodiment of the microwave plasma CVD apparatus according to the present invention.
Figure 19:
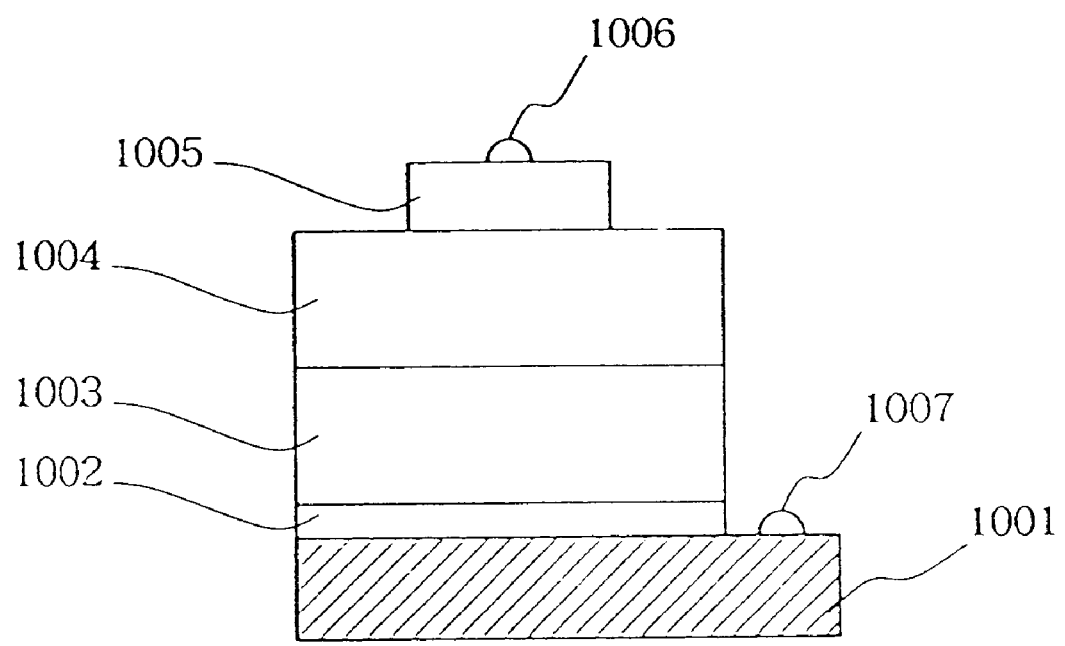
FIG. 19 is a schematic view illustrating the configuration of an example of a Schottky type diode which can be produced according to the present invention.
Figure 20:
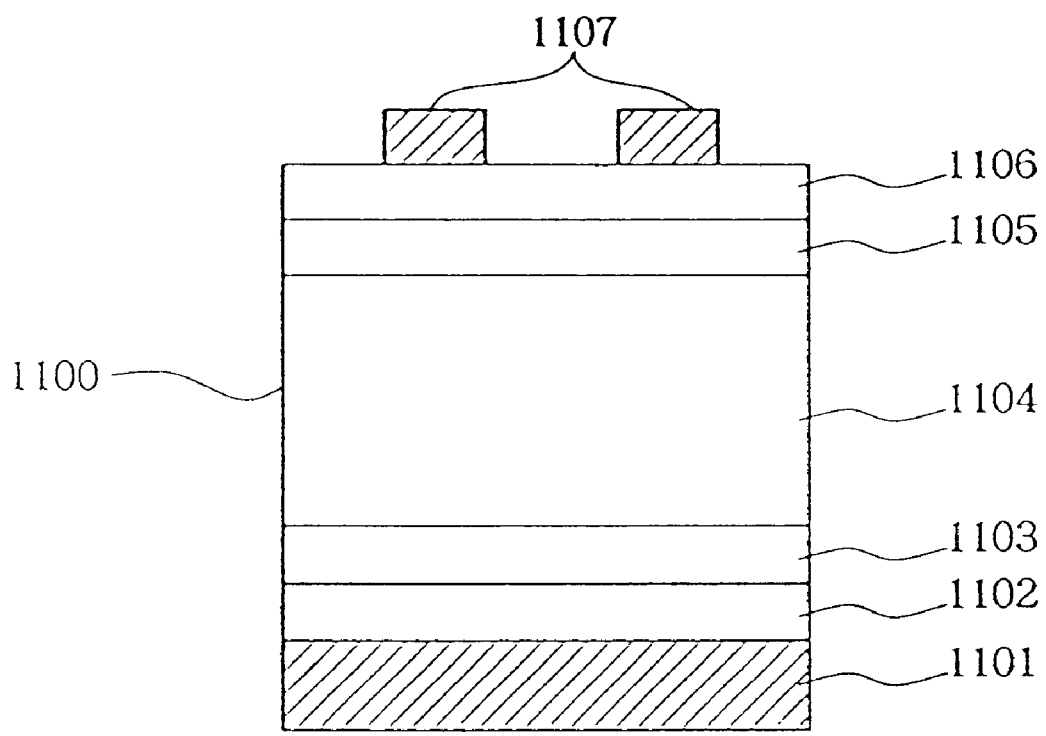
FIG. 20 is a schematic view illustrating the configuration of an example of a pin junction photovoltaic element which can be produced according to the present invention.
Figure 21:
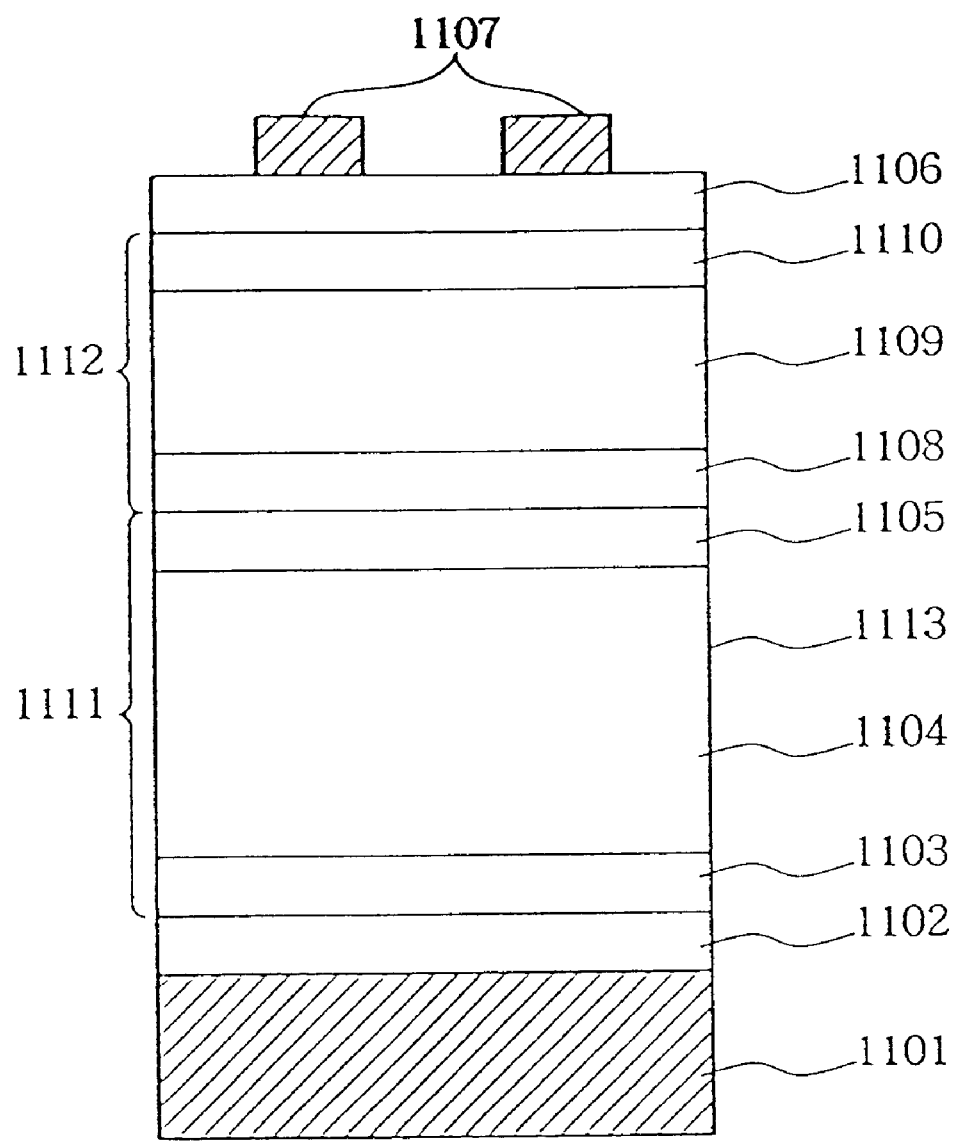
FIG. 21 is a schematic view illustrating the configuration of other example of a pin junction photovoltaic element which can be produced according to the present invention.
Figure 22:
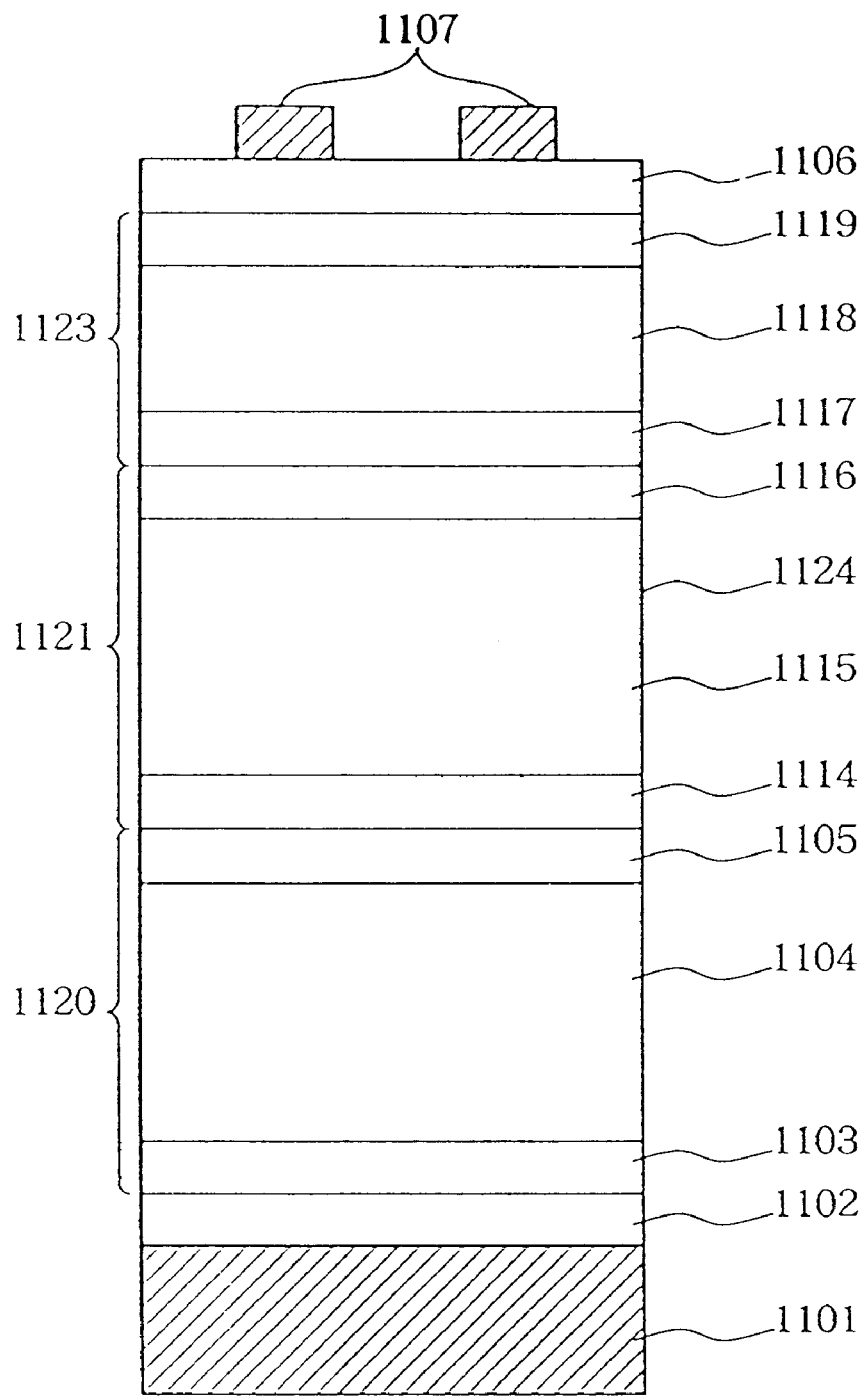
FIG. 22 is a schematic view illustrating the configuration of a further example of a pin junction photovoltaic element which can be produced according to the present invention.
Figure 23:
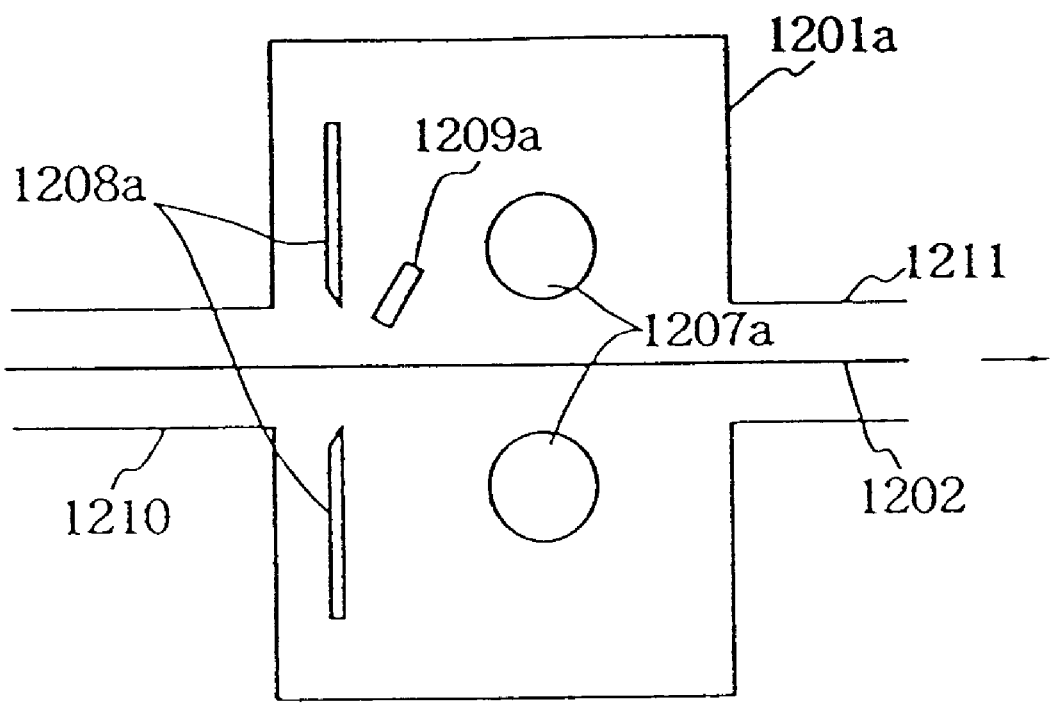
FIG. 23 is a schematic view for explaining the method of processing a web member.
Figure 24:
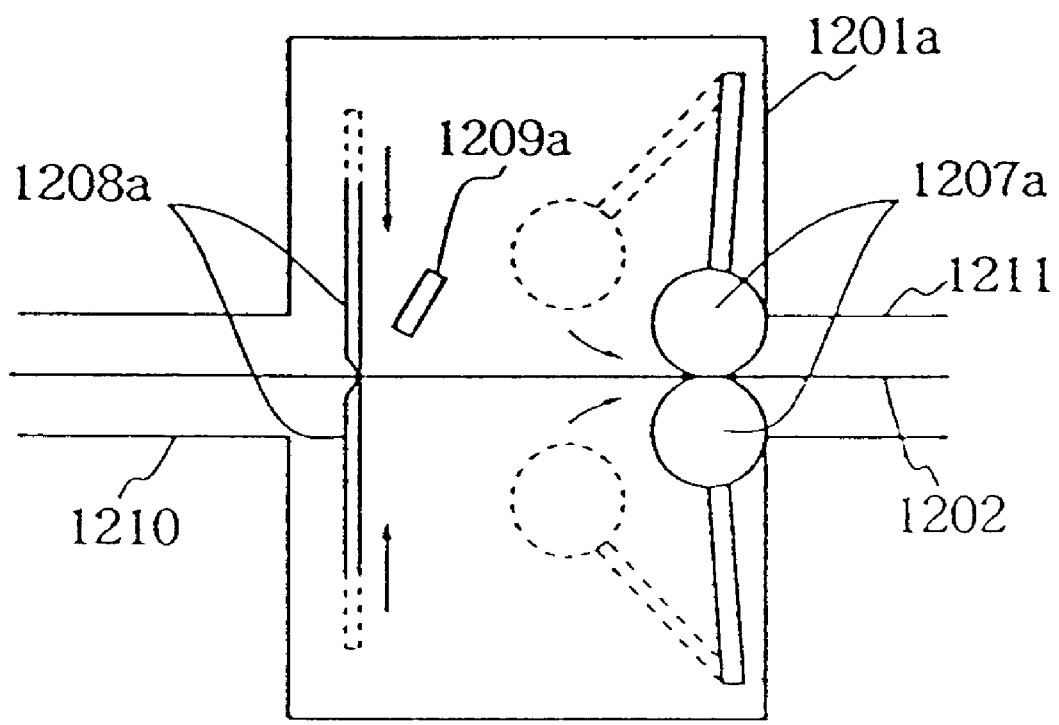
FIG. 24 is a schematic view for explaining the method of processing a web member.
Figure 25:
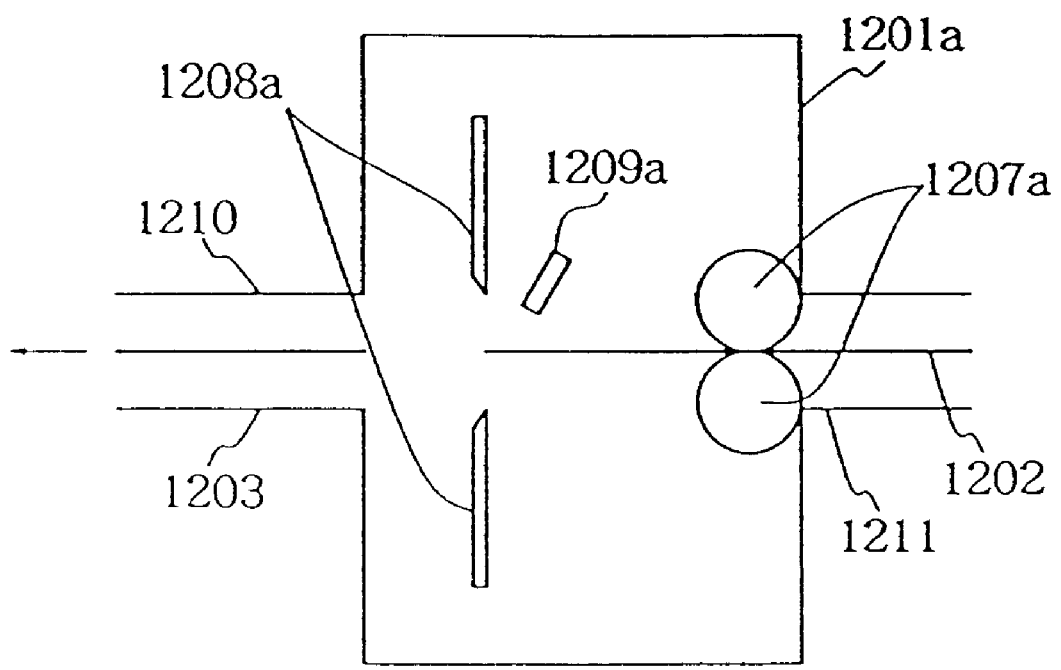
FIG. 25 is a schematic view for explaining the method of processing a web member.
Figure 26:
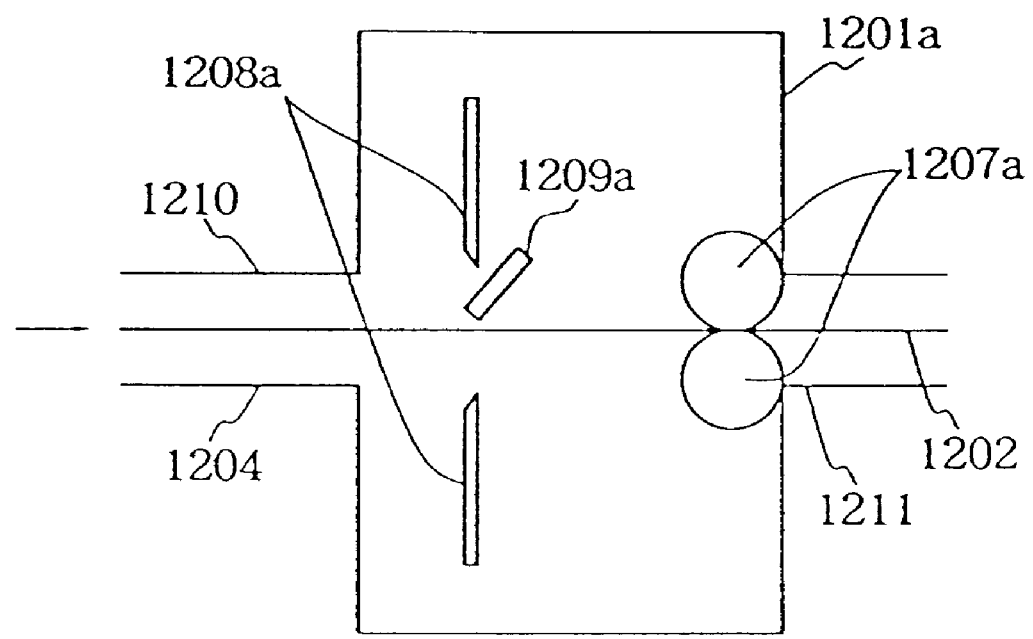
FIG. 26 is a schematic view for explaining the method of processing a web member.
Figure 27:
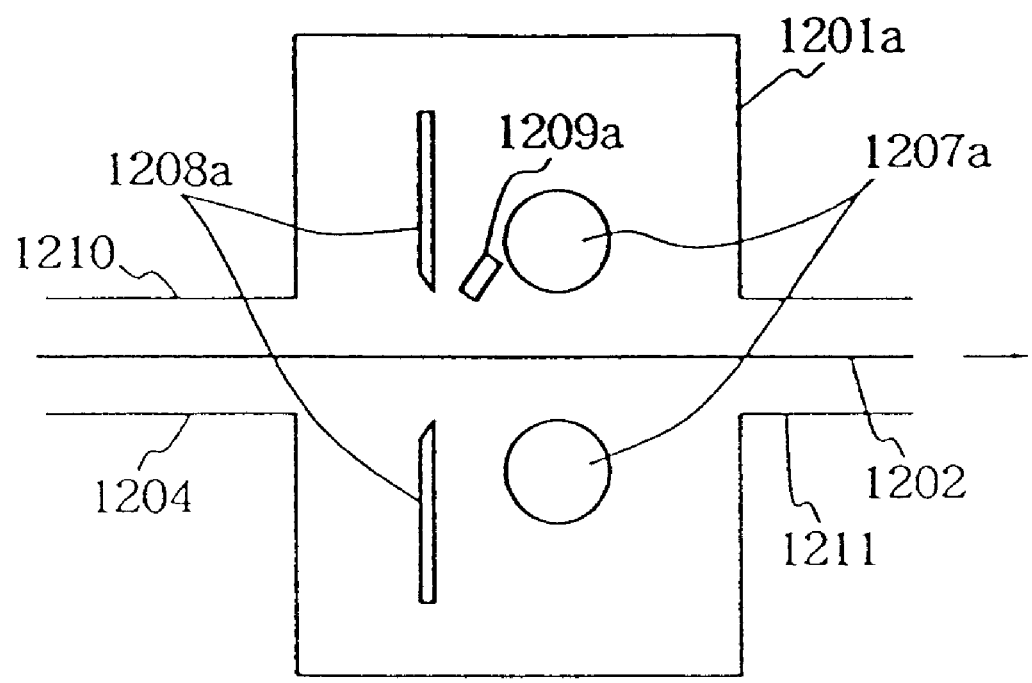
FIG. 27 is a schematic view for explaining the method of processing a web member.
Figure 28:
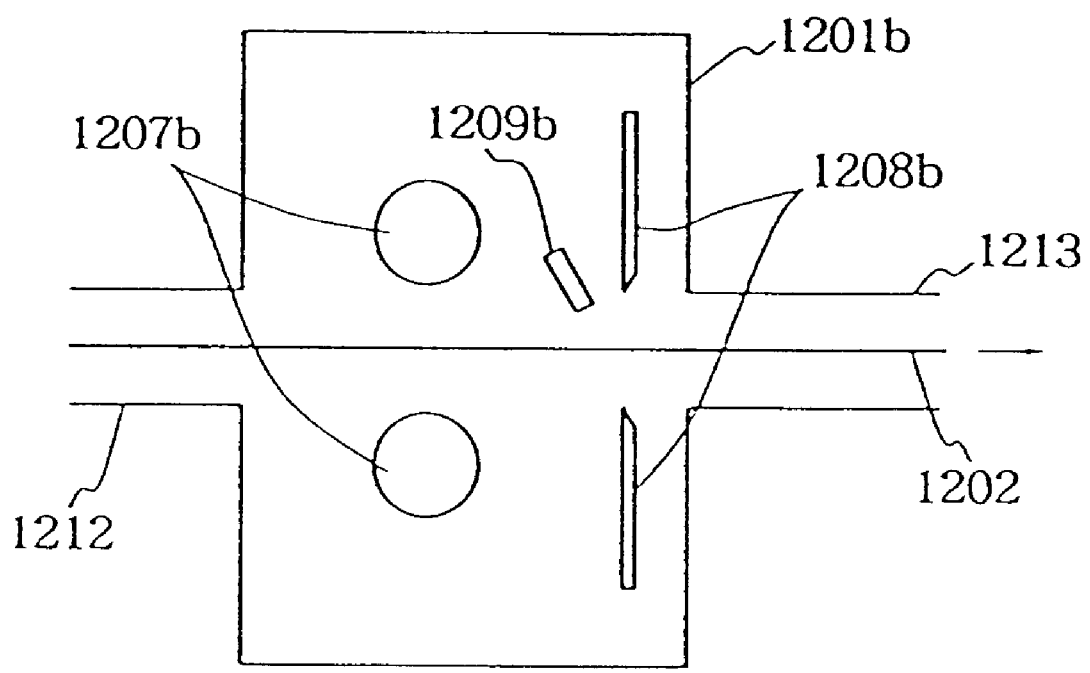
FIG. 28 is a schematic view for explaining the method of processing a web member.
Figure 29:
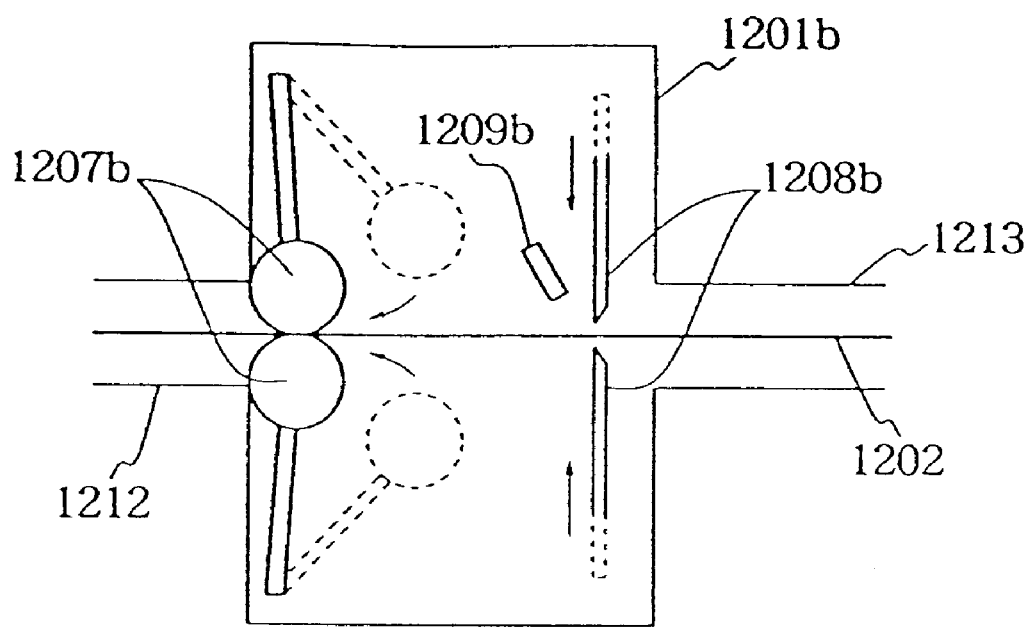
FIG. 29 is a schematic view for explaining the method of processing a web member.
Figure 30:
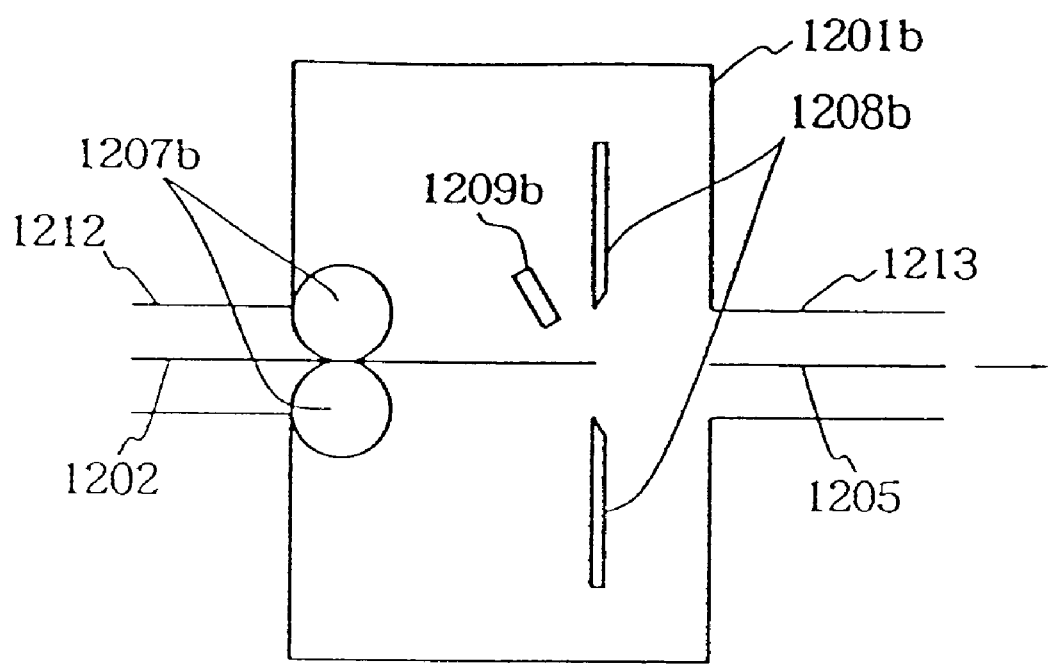
FIG. 30 is a schematic view for explaining the method of processing a web member.
Figure 31:
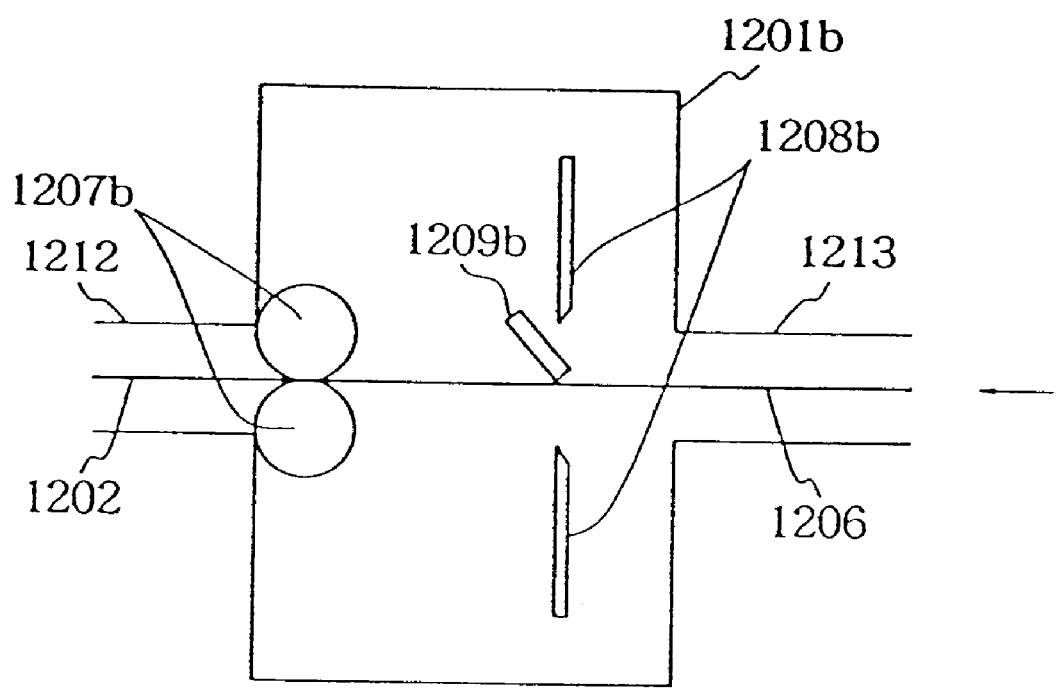
FIG. 31 is a schematic view for explaining the method of processing a web member.
Figure 32:
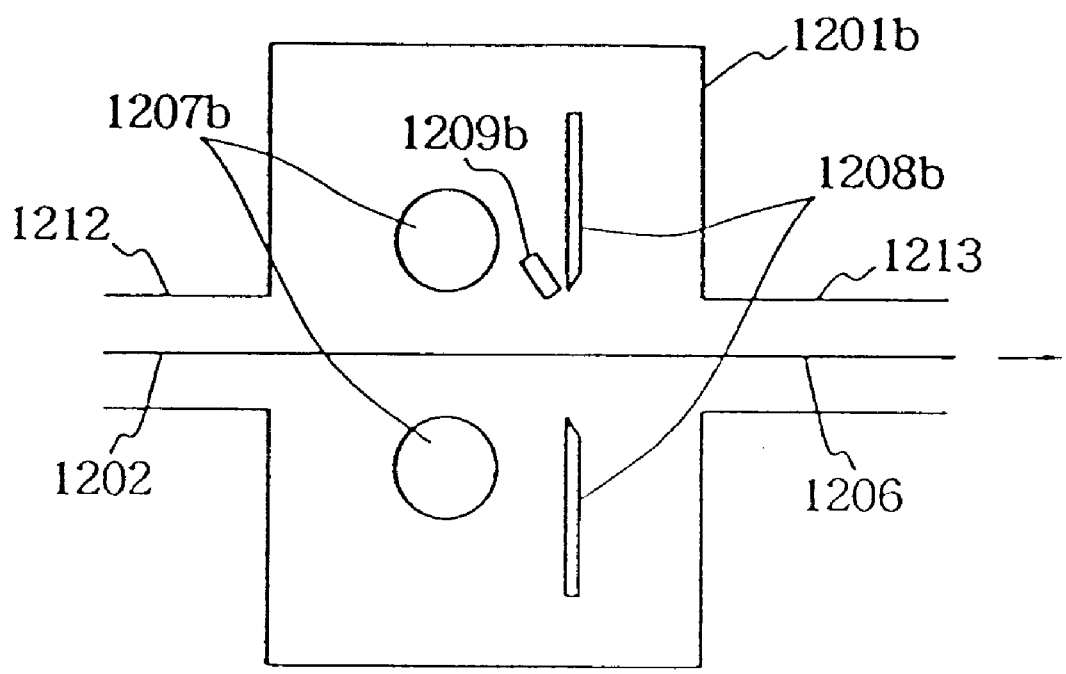
FIG. 32 is a schematic view for explaining the method of processing a web member.

We claim:

1. A plasma chemical vapor deposition (CVD) apparatus for forming a deposited film on a web member composed of a material capable of being constrained by virtue of a magnetic force, comprising a substantially enclosed film-forming space formed by the web member moving in the longitudinal direction for forming said deposited film on said web member, wherein said web member is maintained at a desired temperature, a transportation mechanism for transporting said web member, a temperature controlling mechanism for controlling the temperature of said web member to said desired temperature, said temperature controlling mechanism being covered by a roller shaped magnetic member for contacting said web member thereto by virtue of the magnetic force during the transportation of said web member while forming said deposited film on said web member in said film-forming space, said magnetic member being arranged so as to contact an exterior surface of said web member, which is opposite an interior surface of said web member which is exposed to said plasma.

2. The plasma CVD apparatus according to claim 1, wherein the magnetic member is a part of the transportation mechanism.

3. The plasma CVD apparatus according to claim 1, which is provided with a microwave power supply mechanism for introducing a microwave power into the film-forming chamber to generate the plasma.

4. The plasma CVD apparatus according to claim 3, wherein the microwave power supply mechanism has a microwave coaxial line.

5. The plasma CVD apparatus according to claim 1, wherein the magnetic member is disposed on the exterior surface of said web member and a magnetic permeable material is positioned between the magnetic member and the exterior surface of the web member.

6. The plasma CVD apparatus according to claim 1, wherein the magnetic member comprises a permanent magnet.

7. The plasma CVD apparatus according to claim 6, wherein the permanent magnet is selected from the group consisting of permanent magnets of rare earth elements, ferrite series permanent magnets, alnico series permanent magnets, and Fe—Cr—Co series permanent magnets.

8. The plasma CVD apparatus according to claim 1, wherein the temperature controlling mechanism serves to heat and/or cool the web member.

* * * * *

UNITED STATES PATENT AND TRADEMARK OFFICE
CERTIFICATE OF CORRECTION

PATENT NO. : 5,976,257
DATED : November 2, 1999
INVENTOR(S) : Masahiro Kanai et al.

It is certified that error appears in the above-identified patent and that said Letters Patent is hereby corrected as shown below:

Title page, Item [56],
References Cited, Foreign Patent Documents:
"192374" should read -- 1-092374 --;
"409374     4/1989   Japan" should be deleted;
"1207851" should read -- 1-207851 --;
"1207852" should read -- 1-207852 --;
"4048928" should read -- 4-048928 --; and
"3-30421" should read -- 3-30422 --.

Title page, Item [63],
Related U.S. Application Data, "Continuation of application No. 07/924,001, filed as application No. PCT/JP92/00056, Jan. 23, 1992, abandoned." should read --
Continuation of application No. 07/924,001, filed November 20, 1992, abandoned. --.

Column 1,
Line 21, "area" should read -- area, --;
Line 46, "resulting" should read -- resulting in --.

Column 2,
Line 12, "an d" should read -- and --;
Line 44, "in to" should read -- into --;
Line 45, "an" should read -- a --.

Column 3,
Line 13, "to be" should be deleted.

Column 5,
Line 16, "s low" should read -- slow --;
Lines 18 and 20, "th e" should read -- the --;
Line 25, "document," should read -- document, B-4 --;
Line 44, "expenses are" should read -- expense is --;
Line 45, "which can perform this" should be deleted.

Column 9,
Line 18, "high-skilled" should read -- highly-skilled --.

Column 12,
Line 55, "peri od of t ime" should read -- period of time --;
Line 66, "t he" should read -- the --.

UNITED STATES PATENT AND TRADEMARK OFFICE
CERTIFICATE OF CORRECTION

PATENT NO. : 5,976,257
DATED : November 2, 1999
INVENTOR(S) : Masahiro Kanai et al.

It is certified that error appears in the above-identified patent and that said Letters Patent is hereby corrected as shown below:

Column 13,
Line 10, "Is" should read -- is --;
Line 17, "t he" should read -- the --;
Line 31, "driving" should read -- a driving --.

Column 16,
Line 9, "includes" should read -- include --;
Line 19, "an d" should read -- and --;
Line 49, "It is may" should read -- It may --.

Column 17,
Line 38, "108(B). Numeral" should read -- 108 (B). ¶ Numeral --.

Column 18,
Line 39, "Ill" should read -- 111 --.

Column 19,
Line 34, "There are mentioned" should be deleted and "the" changed to -- The --;
Line 44, "5011" should read -- 501' --.

Column 20,
Line "10r" should read -- 1 or --.

Column 21,
Line 44, "selected" should read -- than --.

Column 22,
Line 67, "en d" should read -- end --.

Column 24,
Line 46, "resul ting" should read -- resulting --.

Column 25,
Line 38, "welsion" should read -- welding --;
Line 47, "a re" should read -- are --.

UNITED STATES PATENT AND TRADEMARK OFFICE
CERTIFICATE OF CORRECTION

PATENT NO.   : 5,976,257
DATED        : November 2, 1999
INVENTOR(S)  : Masahiro Kanai et al.

It is certified that error appears in the above-identified patent and that said Letters Patent is hereby corrected as shown below:

Column 26,
Line 13, "welsion" should read -- welding --;
Line 19, "ar" should read -- are --;
Line 20, "e" should be deleted;
Line 32, "under" should read -- below --;
Line 38, "m" should be deleted;
Line 39, "ore" should read -- more --.

Column 27,
Line 23, "forbitten" should read -- forbidden --.

Column 29,
Line 59, "under" should read -- below --.

Column 30,
Line 4, "under" should read -- below --.

Column 31,
Line 5, "5 mtorr." should read -- 5mTorr --.

Column 33,
Line 66, "becomes" should be deleted.

Column 36,
Line 20, "and" should read -- and --;
Line 64, "120 stable discharge" should read -- stable discharge --.

UNITED STATES PATENT AND TRADEMARK OFFICE
CERTIFICATE OF CORRECTION

PATENT NO.    : 5,976,257
DATED         : November 2, 1999
INVENTOR(S)   : Masahiro Kanai et al.

It is certified that error appears in the above-identified patent and that said Letters Patent is hereby corrected as shown below:

<u>Column 40,</u>
Line 16, "a" should be deleted.

Signed and Sealed this

Fourth Day of December, 2001

*Attest:*

NICHOLAS P. GODICI
*Attesting Officer*    *Acting Director of the United States Patent and Trademark Office*